(12) United States Patent
Shiratake

(10) Patent No.: US 7,099,178 B2
(45) Date of Patent: Aug. 29, 2006

(54) FERROMAGNETIC RANDOM ACCESS MEMORY

(75) Inventor: Shinichiro Shiratake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 18 days.

(21) Appl. No.: 10/987,152

(22) Filed: Nov. 15, 2004

(65) Prior Publication Data
US 2006/0056224 A1    Mar. 16, 2006

(30) Foreign Application Priority Data
Sep. 16, 2004  (JP) ............................. 2004-269954

(51) Int. Cl.
*G11C 11/22*  (2006.01)
*G11C 5/06*   (2006.01)
*G11C 5/10*   (2006.01)

(52) U.S. Cl. ....................................... 365/145; 365/65

(58) Field of Classification Search .............. 365/65, 365/145
See application file for complete search history.

(56) References Cited

U.S. PATENT DOCUMENTS 5,418,750 A    5/1995   Shiratake et al.
6,934,177 B1*  8/2005   Takashima ................. 365/145
2002/0040988 A1* 4/2002  Hidaka et al. ............. 257/296

FOREIGN PATENT DOCUMENTS

JP    2003297078 A   * 10/2003

* cited by examiner

*Primary Examiner*—Amir Zapabian
*Assistant Examiner*—Michael Weinberg
(74) *Attorney, Agent, or Firm*—Oblon, Spivak, McClelland, Maier & Neustadt, P.C.

(57) ABSTRACT

A ferromagnetic random access memory includes a first and second blocks. Each of the first and second blocks includes a switch transistor and memory cells connected in series between a first and second end. The memory cell includes a ferromagnetic capacitor and a cell transistor connected in parallel. A first plate line is connected to each of the first end of the first and second blocks. A first block selection transistor includes a current path one end of which is connected to the second end of the first block. A second block selection transistor includes a current path one end of which is connected to the second end of the second block. A first bit line is connected to each of another end of the current path in the first and second block selection transistors.

15 Claims, 21 Drawing Sheets

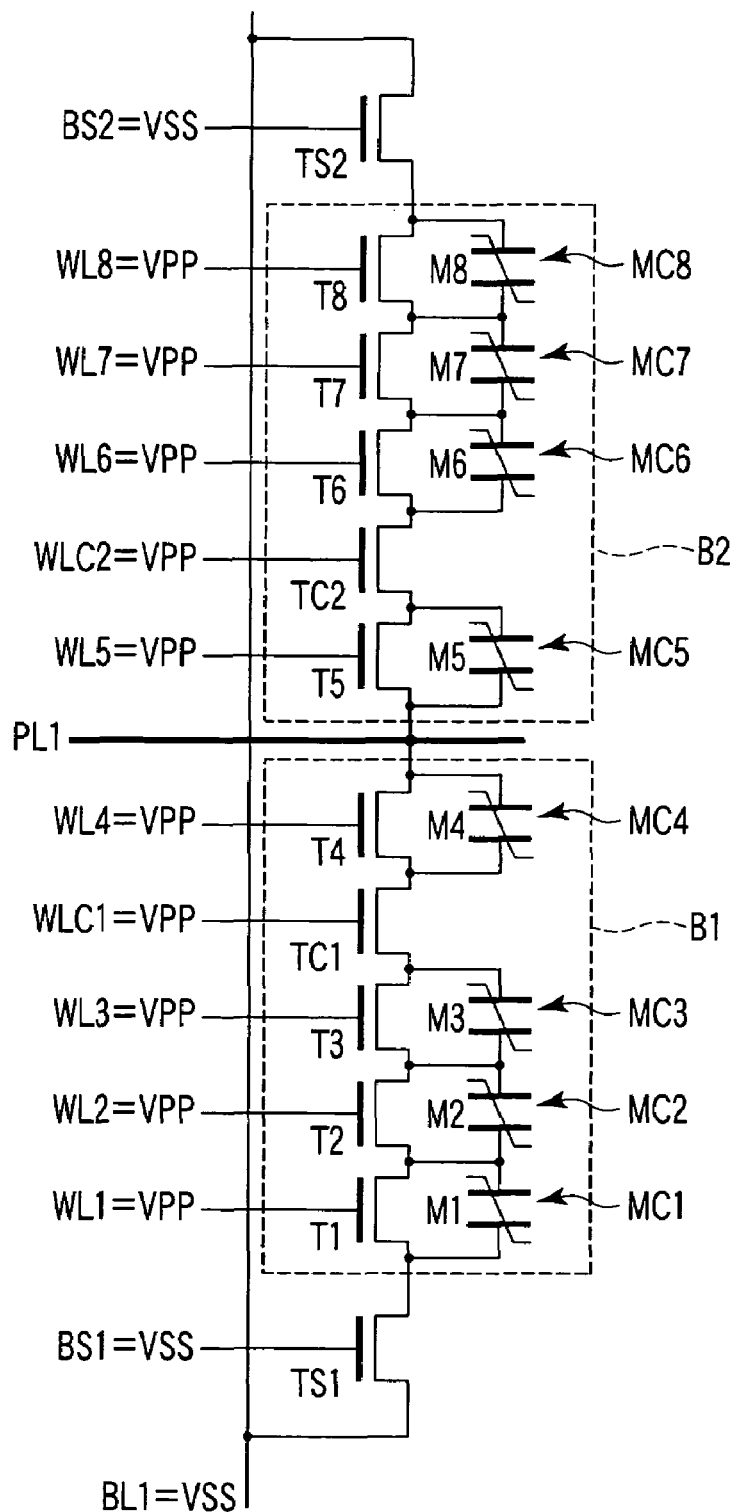
F I G. 1

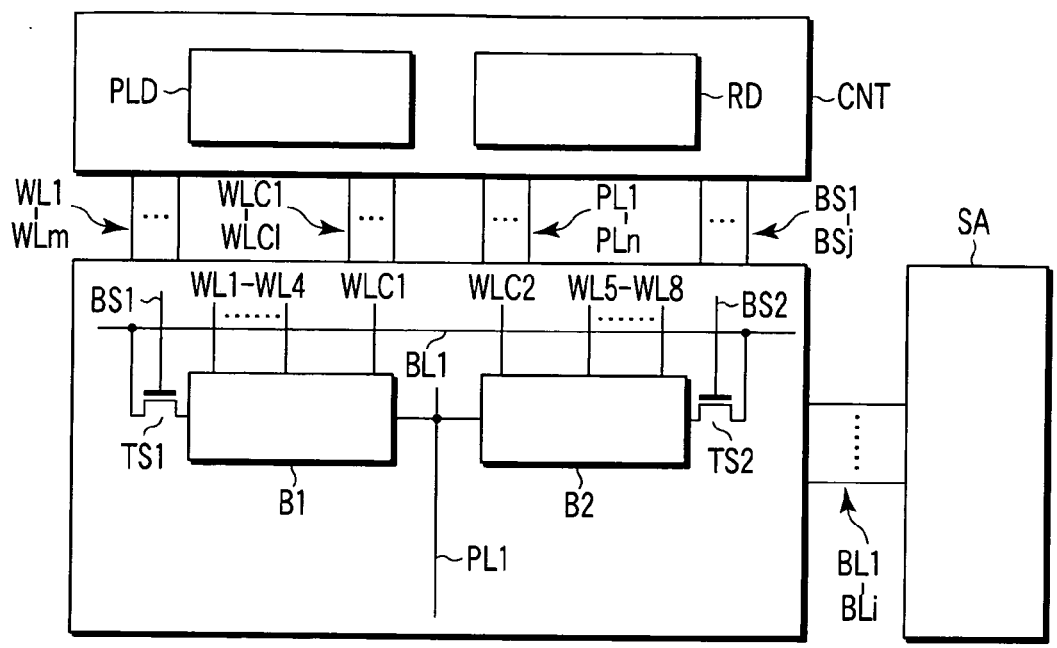
F I G. 2
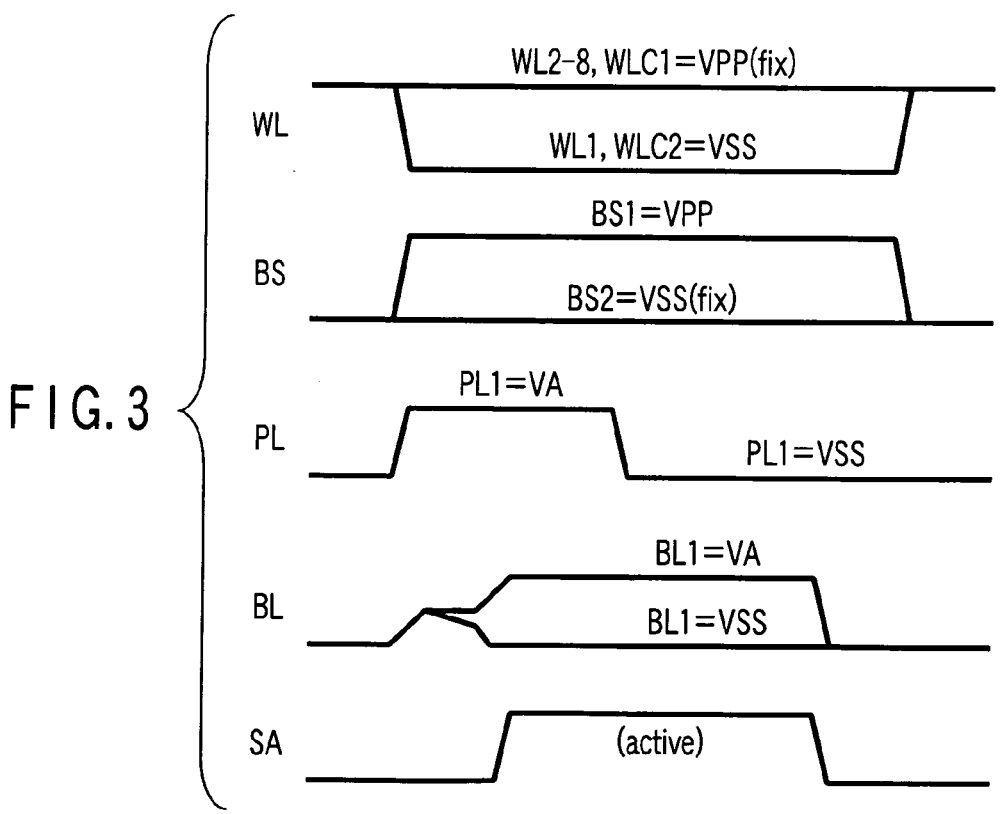
F I G. 3

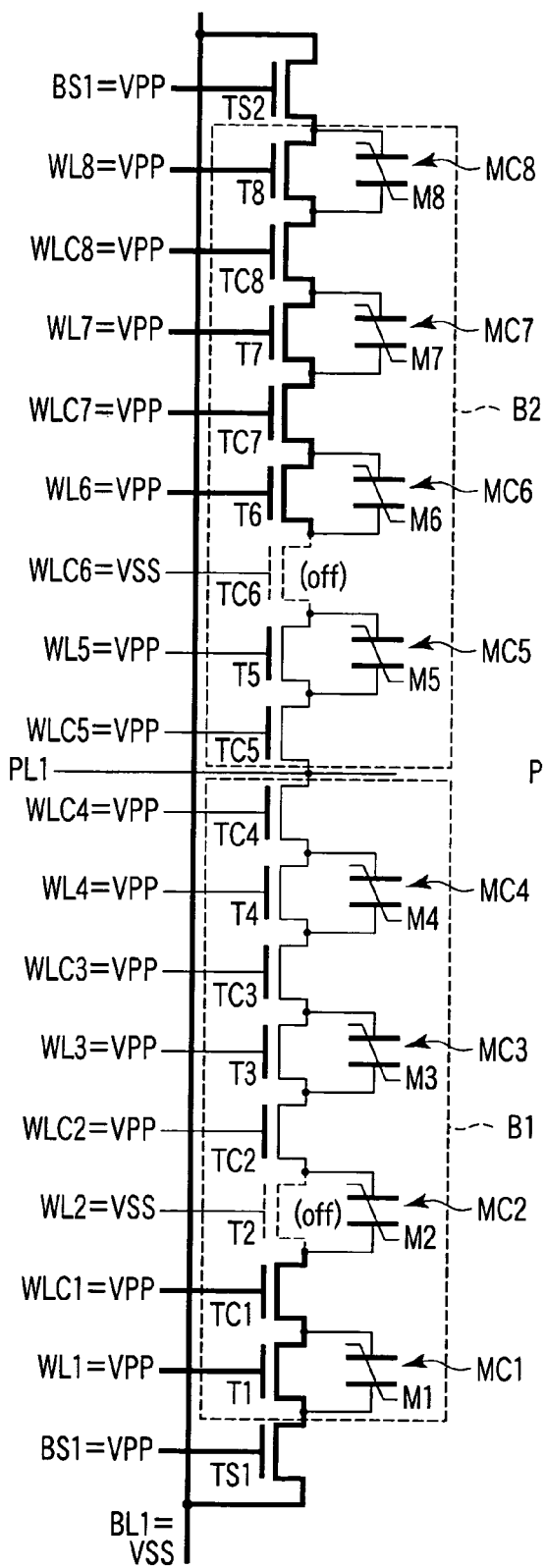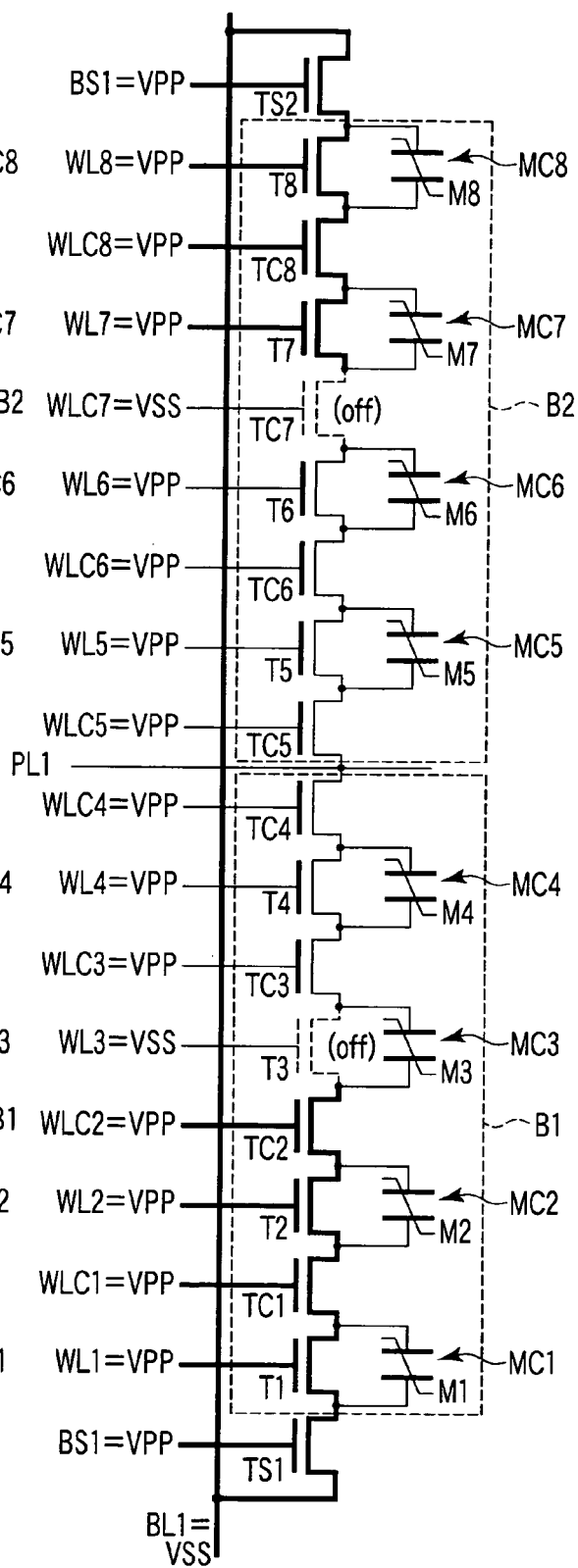
F I G. 20  F I G. 22

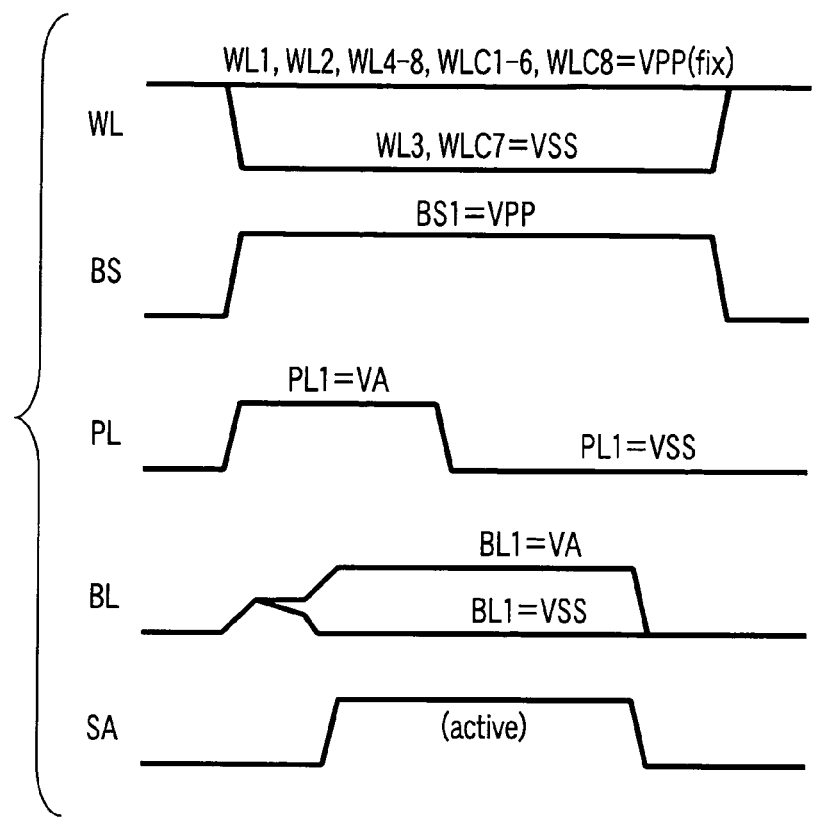
F I G. 21
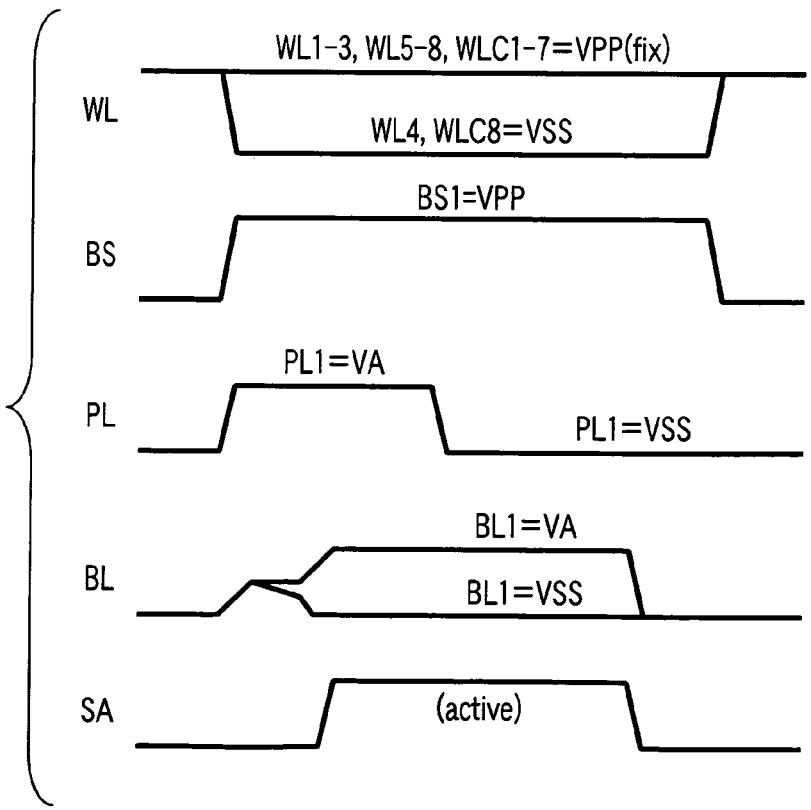
F I G. 23

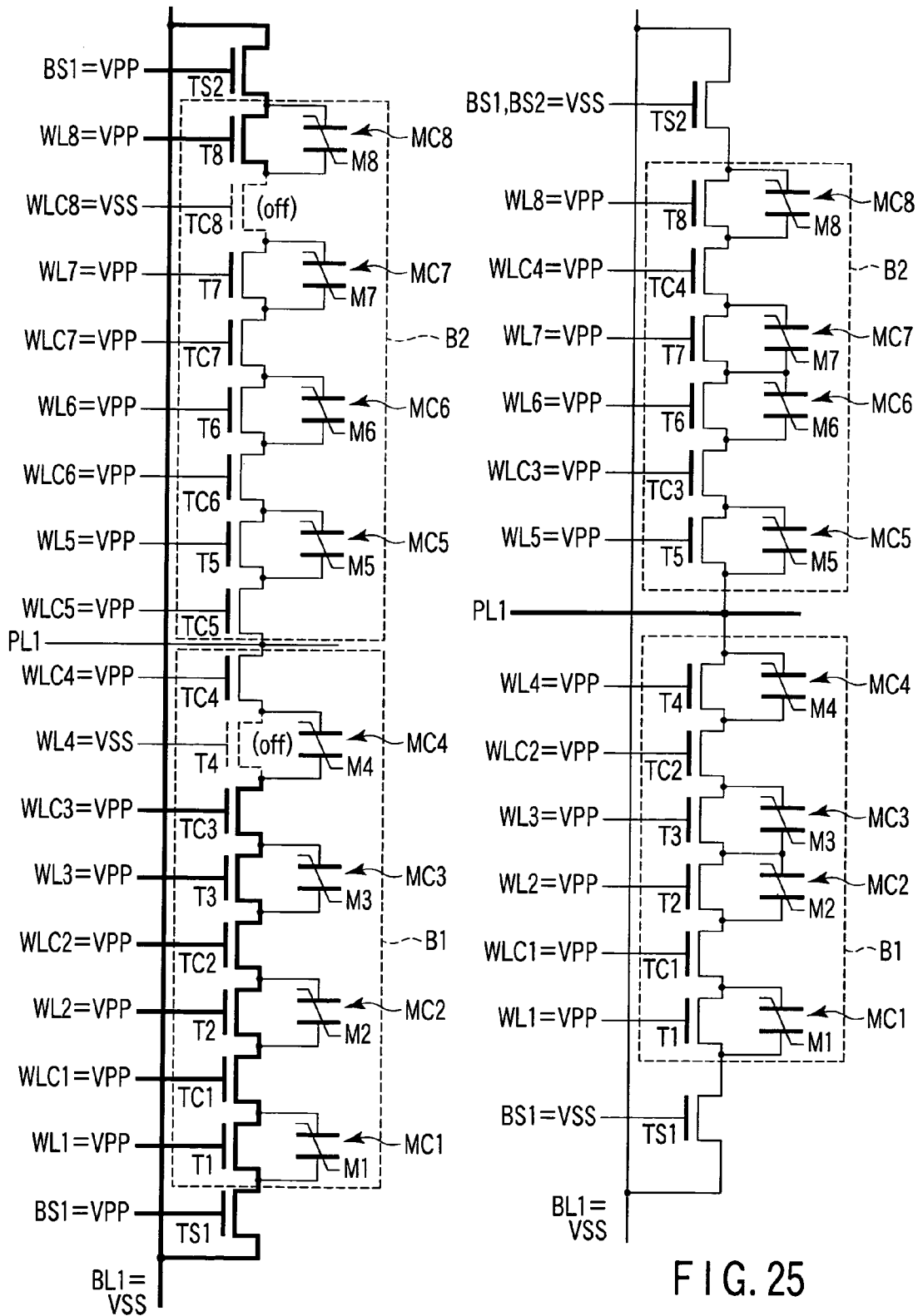
F I G. 24
F I G. 25

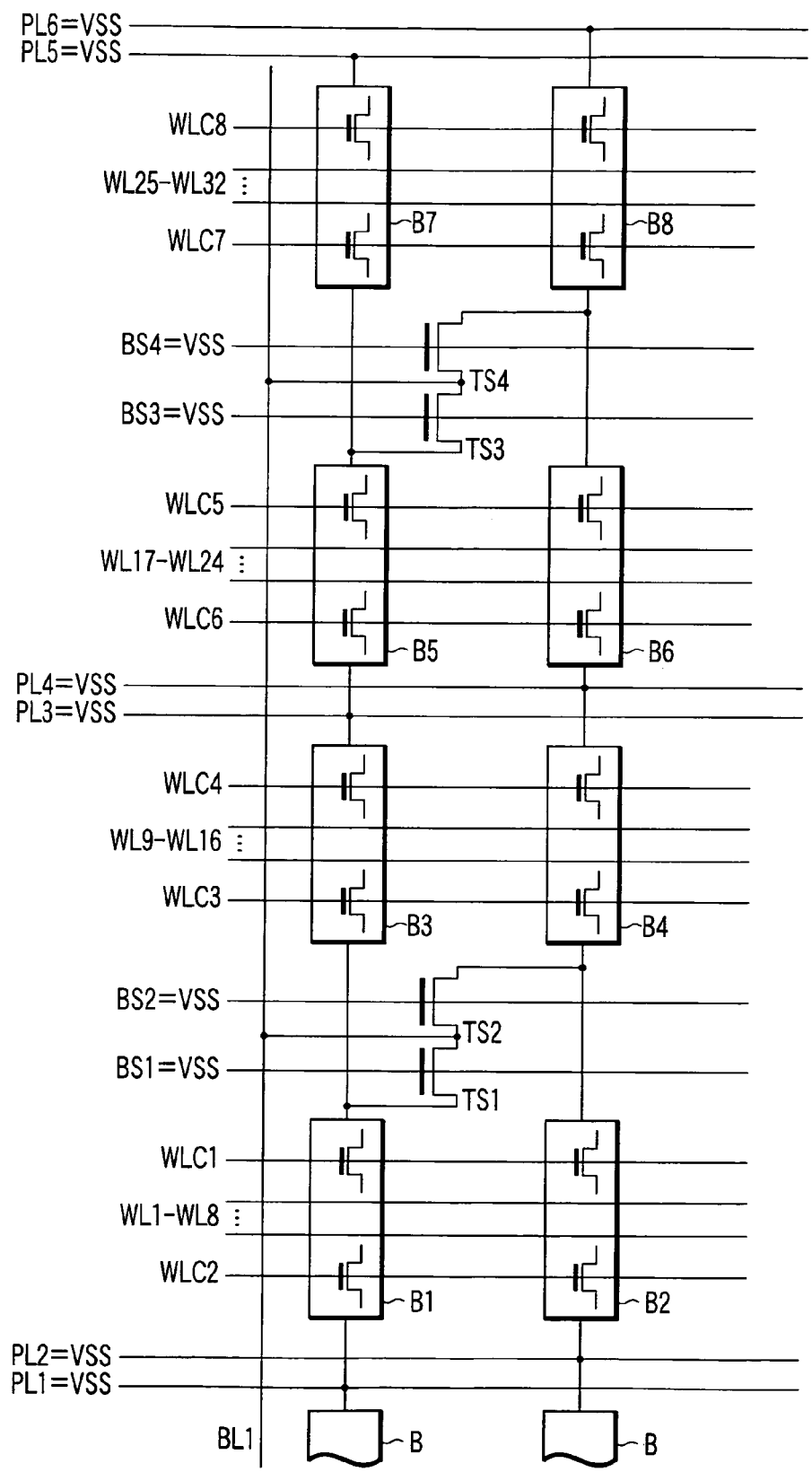
F I G. 35

FERROMAGNETIC RANDOM ACCESS MEMORY

CROSS-REFERENCE TO RELATED APPLICATIONS

This application is based upon and claims the benefit of priority from prior Japanese Patent Application No. 2004-269954, filed Sep. 16, 2004, the entire contents of which are incorporated herein by reference.

BACKGROUND OF THE INVENTION

1. Field of the Invention

The present invention relates to a ferromagnetic random access memory (FeRAM), and for example, to a ferromagnetic random access memory having a structure in which cells each consisting of a ferromagnetic capacitor and a transistor connected together in parallel are connected together in series.

2. Description of the Related Art

A ferromagnetic random access memory so-called TC parallel unit series connected ferromagnetic random access memory is known. In this memory, cells each consisting of a ferromagnetic capacitor (C) and a transistor (T) connected together in parallel are connected together in series, as shown in, for example, Jpn. Pat. Appln. KOKAI Publication No. 2003-297078. A structure in which a plurality of memory cells each consisting of a ferromagnetic capacitor (C) and a transistor (T) connected together in parallel are connected together in series will hereinafter be referred to as a block. One end of each block is connected to a bit line via a block selection transistor. The other end of the block is connected to a plate line.

Normally, cell transistors of all the memory cells are on, with no voltage applied across their capacitors. Further, the block selection transistors are off. When a write or read is executed, the cell transistor of a memory cell to be accessed is turned off. Further, the block selection transistor in the block including this memory cell is turned on. In this state, the plate line is driven (the potential of the plate line is raised) to apply a voltage across the capacitor of the memory cell to be accessed. A potential corresponding to the polarization state of the capacitor is generated in the bit line.

BRIEF SUMMARY OF THE INVENTION

According to a first aspect of the present invention, there is provided a ferromagnetic random access memory comprising: a first block including a first switch transistor and a plurality of first memory cells connected in series between a first end and a second end, the first memory cell including a ferromagnetic capacitor and a cell transistor connected in parallel; a second block including a second switch transistor and a plurality of second memory cells connected in series between a first end and a second end, the second memory cell including a ferromagnetic capacitor and a cell transistor connected in parallel; a first plate line connected to the first end of the first block and the first end of the second block; a first block selection transistor including a current path, one end of the current path being connected to the second end of the first block; a second block selection transistor including a current path, one end of the current path being connected to the second end of the second block; and a first bit line connected to another end of the current path in the first block selection transistor and to another end of the current path in the second block selection transistor.

According to a second aspect of the present invention, there is provided a ferromagnetic random access memory comprising: a first block including a switch transistor and a plurality of memory cells connected in series between a first end and a second end, the memory cell including a ferromagnetic capacitor and a cell transistor connected in parallel; a second block including a switch transistor and a plurality of memory cells connected in series between a first end and a second end, the memory cell including a ferromagnetic capacitor and a cell transistor connected in parallel; a first plate line connected to the first end of the first block; a second plate line connected to the first end of the second block; a first block selection transistor including a current path, one end of the current path being connected to the second end of the first block and to the second end of the second block; and a first bit line connected to another end of the current path in the first block selection transistor.

BRIEF DESCRIPTION OF THE SEVERAL VIEWS OF THE DRAWING

FIG. 1 is a diagram schematically showing a ferromagnetic random access memory according to a first embodiment of the present invention;

FIG. 2 is a diagram showing the relationship between a cell part and a peripheral circuit according to each embodiment;

FIG. 3 is a diagram showing the potentials of main parts of a ferromagnetic random access memory according to a first embodiment;

FIG. 20 is a diagram showing a state observed when the memory cell MC2 of the ferromagnetic random access memory according to the third embodiment is accessed;

FIG. 21 is a diagram showing the potentials of main parts obtained when a memory cell MC3 of the ferromagnetic random access memory according to the third embodiment is accessed;

FIG. 22 is a diagram showing a state observed when the memory cell MC3 of the ferromagnetic random access memory according to the third embodiment is accessed;

FIG. 23 is a diagram showing the potentials of main parts obtained when a memory cell MC4 of the ferromagnetic random access memory according to the third embodiment is accessed;

FIG. 24 is a diagram showing a state observed when the memory cell MC4 of the ferromagnetic random access memory according to the third embodiment is accessed;

FIG. 25 is a diagram schematically showing a ferromagnetic random access memory according to a fourth embodiment of the present invention;

FIG. 35 is a diagram schematically showing a ferromagnetic random access memory according to an eighth embodiment of the present invention.

DETAILED DESCRIPTION OF THE INVENTION

Figure 4:
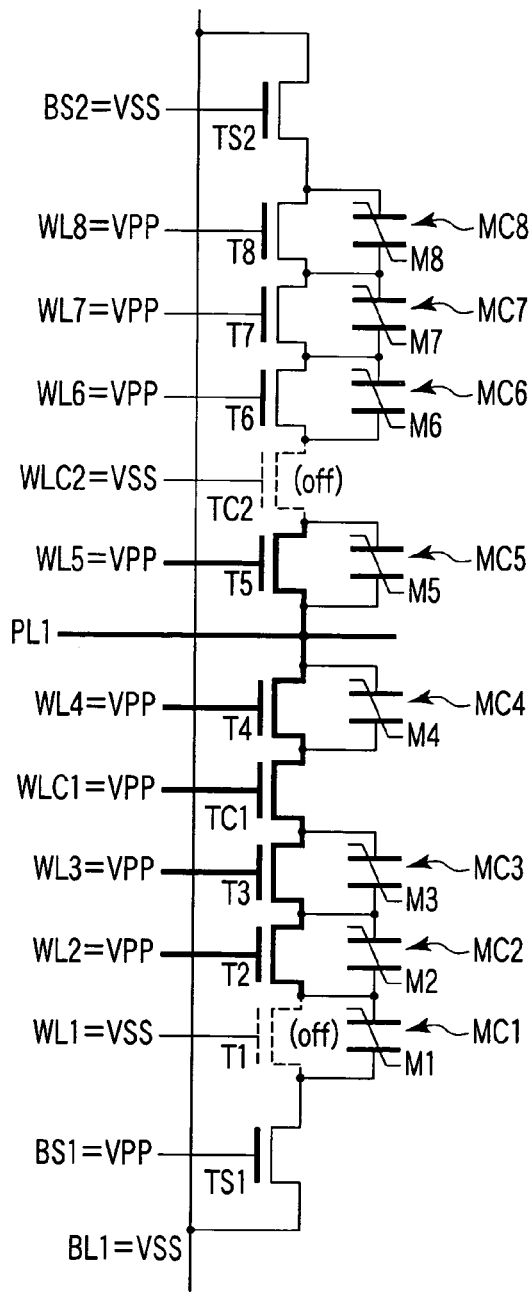
FIG. 4 is a diagram schematically showing a read state of the ferromagnetic random access memory according to the first embodiment.

If a plurality of blocks are connected to one plate line, the parasitic capacitance of transistors of memory cells in these blocks is added to the plate line. The parasitic capacitance increases power consumption required to raise the potential of the plate line up to a desired value when the plate line is driven. This increases the power consumption of the ferromagnetic random access memory.

A block selection transistor is provided in each block. The block selection transistors are connected to the bit line, thus increasing the parasitic capacitance of the bit line. Thus, a potential corresponding to charges read from the ferromagnetic capacitor onto the bit line decreases consistently with increasing capacitance of the bit line. The area of a memory cell array increases consistently with the number of block selection transistors depending on a space for wiring connected to the block selection transistors.

Embodiments of the present invention will be described below with reference to the drawings. In the description below, components having substantially the same functions and configurations are denoted by the same reference numerals. A duplicate description will be given as required.

(1) First Embodiment

[1-1] Configuration

FIG. 1 is a diagram schematically showing a ferromagnetic random access memory according to a first embodiment of the present invention. Further, FIG. 1 also shows the potentials of parts of the memory during a standby state. These potentials will be described below when operations are described. As shown in FIG. 1, blocks B1 and B2 are provided between a plate line PL1 and a bit line BL1. The block B1 has one end connected to the plate line and the other end connected to the bit line BL1 via an n-type block selection transistor TS1. A block selection line BS1 is connected to a gate of the block selection transistor TS1.

Likewise, the block B2 has one end connected to the plate line PL1 and the other end connected to the bit line BL1 via an n-type block selection transistor TS2. A block selection line BS2 is connected to a gate of a block selection transistor TS2.

The block B1 has memory cells MC1 to MC4 and at least one n-type switch transistor TC1. One memory cell is composed of a ferromagnetic capacitor and an n-type cell transistor connected together in parallel. Specifically, the memory cells MC1 to MC4 are composed of ferromagnetic capacitors M1 to M4 and cell transistors T1 to T4, respectively, connected together in parallel. Gates of the cell transistors T1 to T4 are connected to word lines WL1 to WL4, respectively. The switch transistor TC1 is provided between any two of the memory cells MC1 to MC4. FIG. 1 shows an example in which the switch transistor TC1 is connected between the memories MC3 and MC4. A signal line (word line) WLC1 is connected to the gate of the switch transistor.

The block B2 has memory cells MC5 to MC8 and at least one n-type switch transistor TC2. The memory cells MC5 to MC8 are composed of ferromagnetic capacitors M5 to M8 and cell transistors T5 to T8, respectively, connected together in parallel. Gates of the cell transistors T5 to T8 are connected to word lines WL5 to WL8, respectively. The switch transistor TC2 is provided between any two of the memory cells MC5 to MC8. FIG. 1 shows an example in which the switch transistor TC2 is connected between the memories MC5 and MC6. A signal line WLC2 is connected to the gate of the switch transistor TC1.

FIG. 2 is a diagram showing the relationship between the configuration (cell part) shown in FIG. 1 and a peripheral circuit. As shown in FIG. 2, the plate line PL1 is connected to a plate line driving circuit PLD. The plate line driving circuit PLD supplies a plate line driving potential (array potential) to the plate line PL1 when accessing the memory cells MC1 to MC8. Word lines WL1 to WL8 are connected to a control circuit CNT including a row decoder RD or the like. The control circuit CNT controls the potentials of the word lines WL1 to WL8 so that the cell transistors T1 to T8 of the memory cells MC1 to MC8 to be accessed are electrically connected to the plate line PL1 and bit line BL1. The control circuit CNT also controls the potentials of the signal lines WLC1 and WLC2 and block selection lines BS1 and BS2. The bit line BL1 is connected to a sense amplifier SA. The sense amplifier SA compares a potential generated in the bit line BL1 on a read with, for example, a reference potential. The sense amplifier SA amplifies the difference between these two potentials to determine information possessed by the memory cell MC1 to MC8 to be subjected to a read. FIG. 2 shows that plate lines PL2 to PLn (n is a natural number) according to the embodiment described later are connected to a plate line driving circuit PL. Word lines WL9 to WLm, signal lines WLC3 to WLC1, BL2 to BLi, and BS3 to BSj (m, l, i, and j are natural numbers) are also connected to the control circuit CNT, the sense amplifier SA, and the like.

[1-2] Operation

A description will next be given of operations of the ferromagnetic random access memory according to the first embodiment, taking a read from the memory cell MC1 by way of example. FIG. 3 is a diagram showing the potentials of main parts of the ferromagnetic random access memory in FIG. 1, during one read cycle. FIG. 4 is a diagram schematically showing a read state of the ferromagnetic random access memory in FIG. 1. As shown in FIGS. 1 and 3, in a standby state, the word lines WL1 to WL8 and the signal lines WLC1 and WLC2 are at a potential VPP (high level). Accordingly, the cell transistors T1 to T8 and the switch transistors TC1 and TC2 are on. Further, the block selection line BS1 is at a ground potential VSS. The ground potential VSS (low level) is typically at 0V. Further, the plate line PL1 is at the potential VSS, and the bit line BL1 is at the potential VSS. A signal SA controlling the sense amplifier SA is at a low level. Accordingly, the sense amplifier SA is not in operation.

Then, upon a read, the word line WL1 connected to the memory cell MC1 to be subjected to the read is set at the potential VSS. Further, the signal line WLC2 connected to the switch transistor TC2 included in the block B2, which is different from the block B1 including the memory cell MC1, is set at a low level. The word lines WL2 to WL8 and the signal line WLC1 are maintained at a potential VPP. As a result, as shown in FIG. 4, the selection transistor T1 is turned off, and the block selection transistor TS1 is turned on. The ferromagnetic capacitor M1 is electrically connected to the plate line PL1 and bit line BL1. Further, the switch transistor TC2 is turned off to disconnect the memory cells MC6 to MC8 (cell transistors T6 to T8) from the plate line PL1, the memory cells MC6 to MC8 being arranged between the switch transistor TC2 and bit line BL1 in the block B2. FIG. 4 shows that the transistors shown by broken lines are off. This also applies to the subsequent figures.

The operations performed until immediately before the memory shifts to the subsequent standby operation are the same as those of a normal TC parallel unit series connected ferromagnetic access memory. That is, the potential of the plate line PL1 is driven to an array potential VA. The array potential VA is lower than the potential VPP and is equal to a potential required to generate a potential in the bit line BL1 which corresponds to the amount of polarization held by the ferromagnetic capacitor M1 to M8. The potential of the plate line PL1 is applied to the ferromagnetic capacitor T1 to cause a potential corresponding to the polarization state of the ferromagnetic capacitor T1 to appear on the bit line BL1. Subsequently, the control signal SA for the sense amplifier is set at a high level to activate the sense amplifier SA. The sense amplifier SA compares a reference potential Vref with the potential on the bit line BL1 and executes amplification. As a result, the potential on the bit line BL1 is amplified to the array potential VA or the ground potential VSS. Consequently, the information held by the ferromagnetic capacitor M1 is determined.

Then, the plate line PL is set at a potential VSS, and then the sense amplifier SA is turned off. The block selection signal BS1 is set at the potential VSS, and the word lines WL1 and WLC2 is set at the potential VPP. Therefore, the ferromagnetic memory shifts to the standby state.

[1-3] Variation

Figure 5:
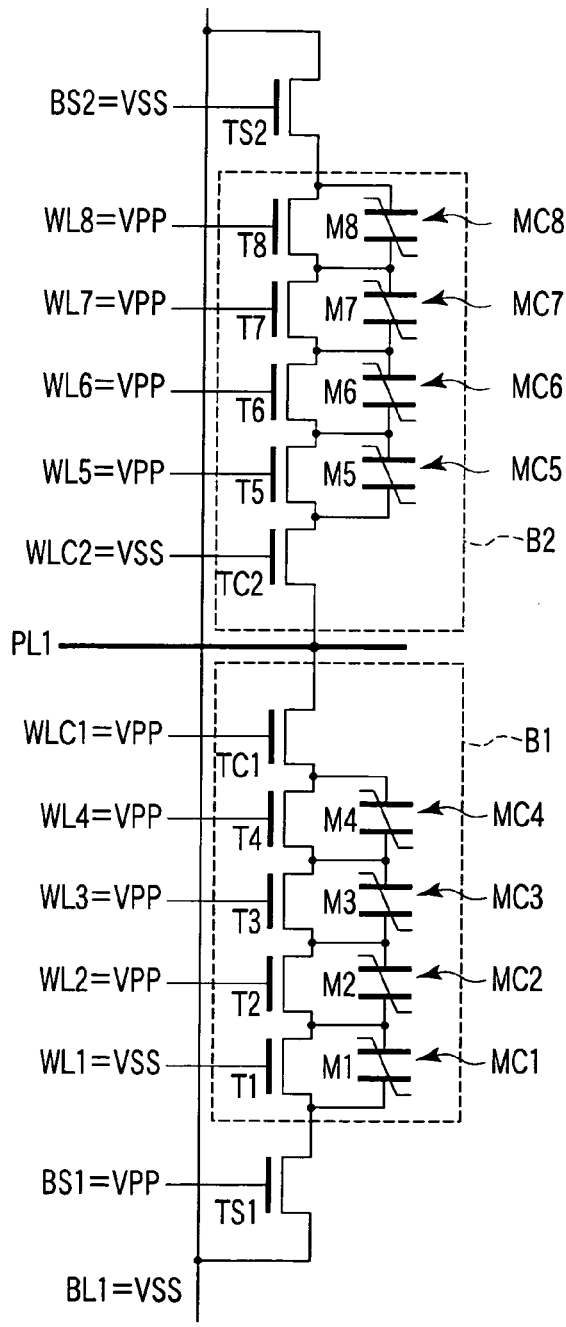
FIG. 5 is a diagram schematically showing a ferromagnetic random access memory according to a variation of the first embodiment of the present invention.
Figure 6:
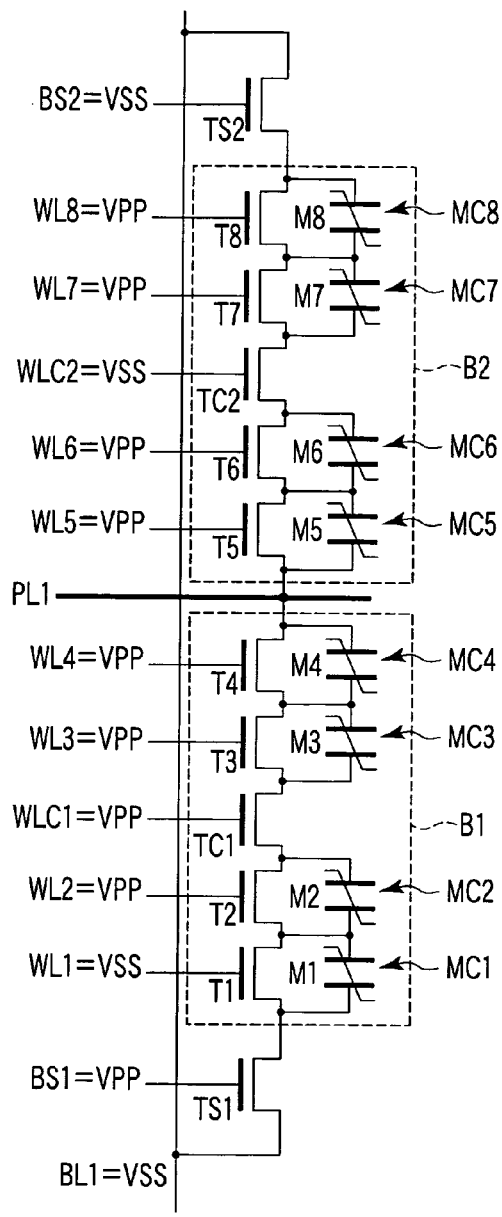
FIG. 6 is a diagram schematically showing a ferromagnetic random access memory according to a variation of the first embodiment of the present invention.

FIGS. 5 and 6 are diagrams schematically showing a ferromagnetic random access memory according to a variation of the first embodiment. The switch transistors TC1 and TC2 may be connected between any memory cells MC provided as long as the transistors TC1 and TC2 are connected in series with the memory cells MC1 to MC8 (in the description below, if the memory cell or memory cells need not be individually identified, they will hereinafter be collectively described as the memory cell MC. This applies to other reference numerals in the blocks B1 and B2) in the blocks B1 and B2, respectively.

In the example in FIG. 5, the switch transistor TC1 is connected between the memory cell MC4 and the plate line PL1. The switch transistor TC2 is connected between the memory cell MC5 and the plate line PL1.

In the example in FIG. 6, the switch transistor TC1 is connected between the memory cell MC2 and the memory cell MC3. The switch transistor TC2 is connected between the memory cell MC6 and the memory cell MC7.

Operations including changes in the potentials of main parts are the same as those shown in FIG. 1. The switch transistors TC may be asymmetric with respect to the plate line PL1 in the blocks B1 and B2.

[1-4] Effects

In the ferromagnetic random access memory according to the first embodiment of the present invention, the block B has a plurality of memory cells MC and switch transistors TC connected together in series. When any one memory cell MC in the two or more blocks B connected to the one plate line PL is accessed, the switch transistors TC in the remaining blocks B are turned off. Accordingly, the memory cell MC between the switch transistor TC and the bit line BL is disconnected from the plate line PL. This reduces the parasitic capacitance of the plate line PL1 compared to the case where the switch transistors TC are not provided. This in turn reduces the power required to drive the plate line PL to the array potential VA and thus the power consumption of the ferromagnetic random access memory.

The closer to the plate line PL the switch transistor TC is inserted into the block, the smaller the parasitic capacitance of the plate line PL is. Thus, in terms of a reduction in the power required to drive the plate line PL, the switch transistor TC is preferably provided between the plate line PL and the memory cell MC located at an end of the block B or between the memory cell MC located at the end of the block B and the second memory cell MC.

(2) Second Embodiment

[2-1] Configuration

Figure 7:
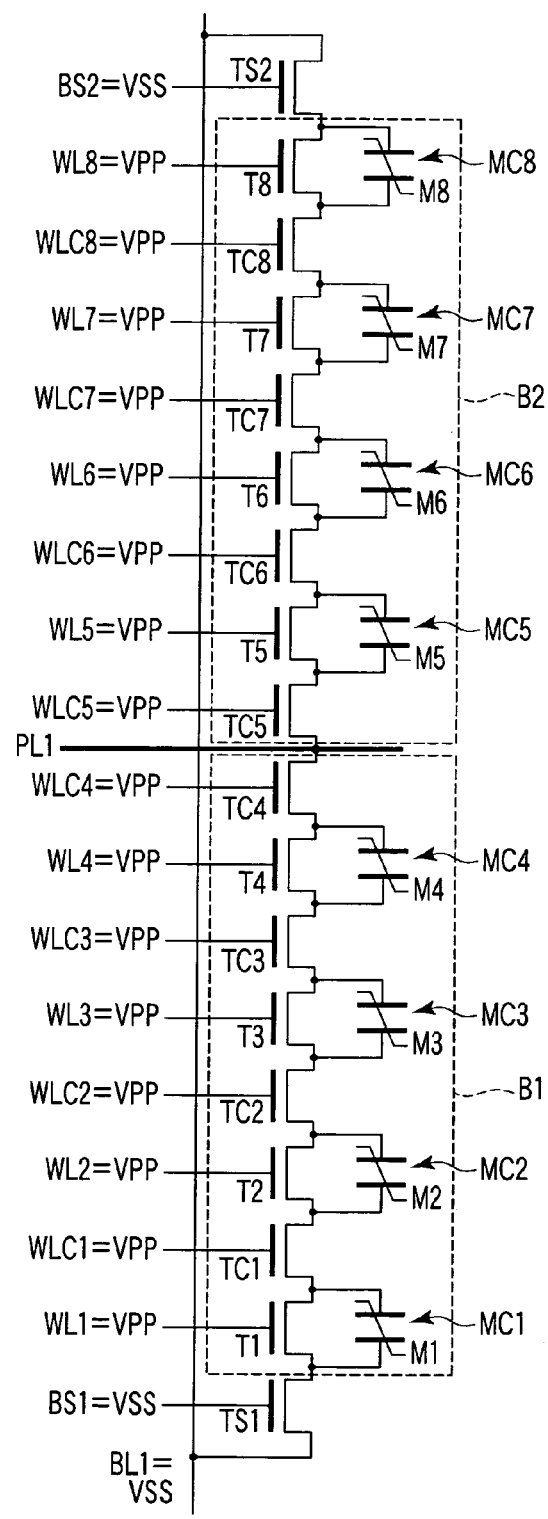
FIG. 7 is a diagram schematically showing a ferromagnetic random access memory according to a second embodiment of the present invention.

In a second embodiment, the switch transistor TC is provided between the memory cells MC and between the memory cell MC and the plate line PL1. FIG. 7 is a diagram schematically showing a ferromagnetic random access memory according to a second embodiment of the present invention. As shown in FIG. 7, the block B2 has the same number of memory cells MC as the block B1.

Further, in the block B1, the switch transistor TC1 is provided between the memory cells MC1 and MC2. The switch transistor TC2 is provided between the memory cells MC2 and MC3. The switch transistor TC3 is provided between the memory cells MC3 and MC4. The switch transistor TC4 is provided between the memory cell MC4 and the plate line PL1. The signal lines WLC1 to WLC4 are connected to the gates of the switch transistors TC1 to TC4, respectively.

In the block B2, the switch transistor TC5 is provided between the plate line PL1 and the memory cell MC5. The switch transistor TC6 is provided between the memory cells MC5 and MC6. The switch transistor TC7 is provided between the memory cells MC6 and MC7. The switch transistor TC8 is provided between the memory cells MC7 and MC8. The signal lines WLC5 to WLC8 are connected to the gates of the switch transistors TC5 to TC8, respectively.

In this manner, each of the blocks B1 and B2 is provided with the same number of memory cells MC and the same number of switch transistors TC. As a result, plural sets of the memory cell MC and the switch transistor TC are provided, such as the memory cell MC1 and the switch transistor TC1 and the memory cell MC2 and the switch transistor TC2. In the above example, in the memory cell MC and switch transistor TC set, the memory cell is located closer to the bit line BL1 within the blocks B1 and B2. The switch transistor TC is located closer to the plate PL1 within the blocks B1 and B2. However, the positional relationship between the memory cell MC and the switch transistor TC may be reversed. Moreover, the positional relationship between the memory cell MC and switch transistor TC in the memory cell MC and switch transistor TC set may vary between the blocks B1 and B2. This configuration produces the same effects as those described later. The description of the positional relationship between the memory cell MC and the switch transistor TC also applies to a third and subsequent embodiments, described later.

[2-2] Operation

Figure 8:
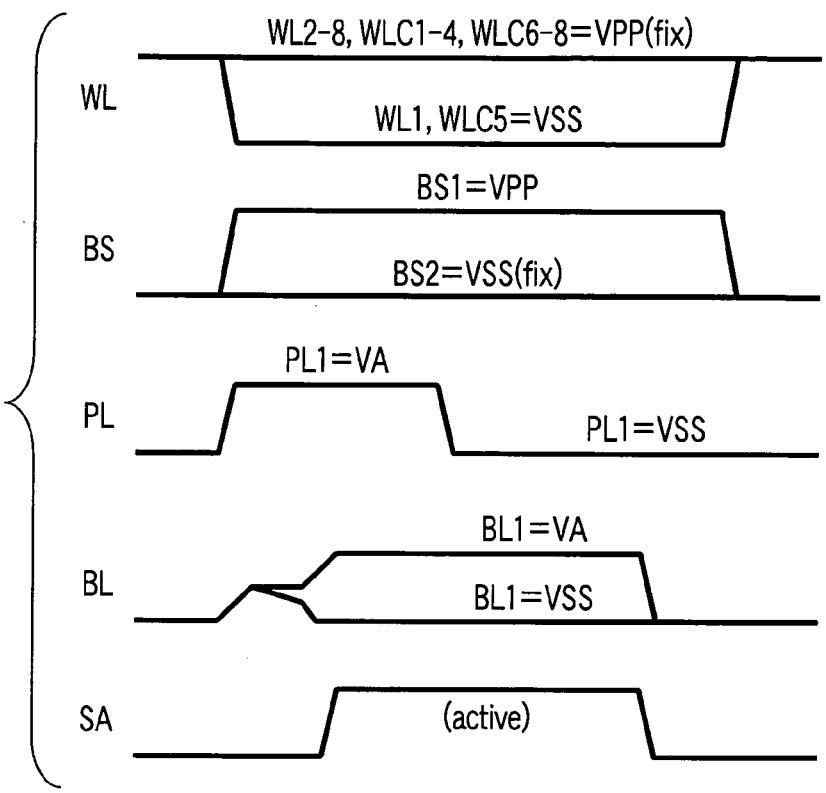
FIG. 8 is a diagram showing the potentials of main parts obtained when a memory cell MC1 of the ferromagnetic random access memory according to the second embodiment is accessed.
Figure 9:
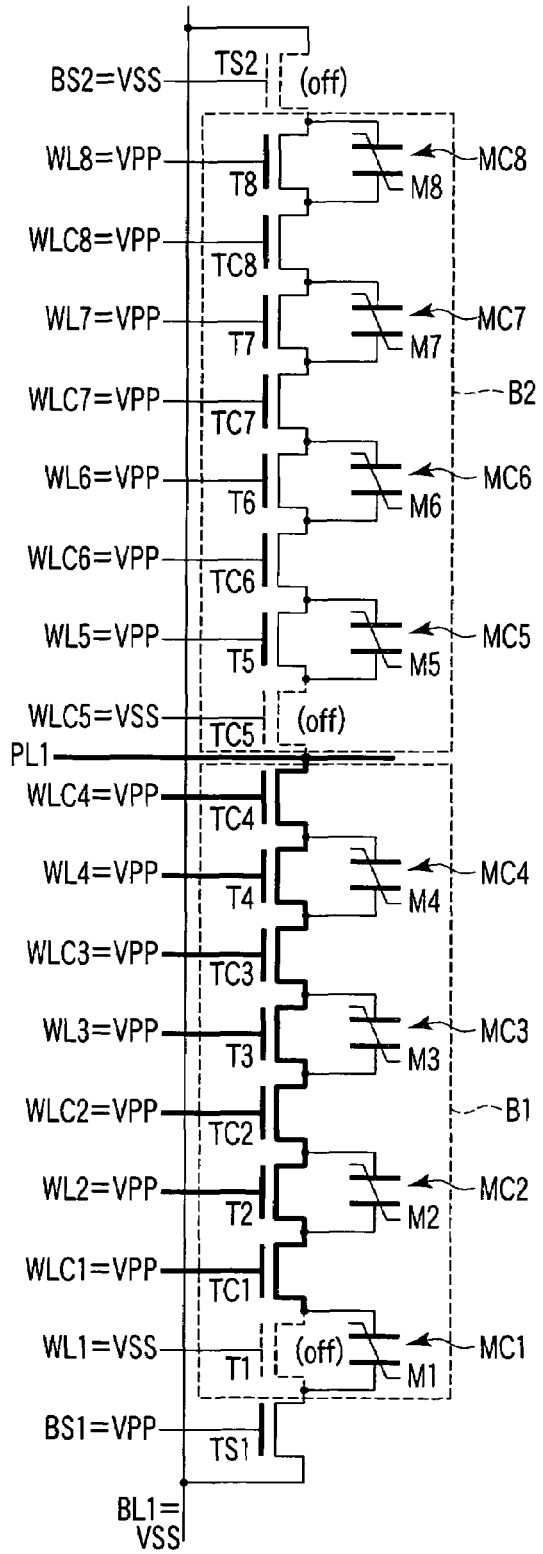
FIG. 9 is a diagram showing a state observed when the memory cell MC1 of the ferromagnetic random access memory according to the second embodiment is accessed.

With reference to FIGS. 8 to 15, description will next be given of operations of the ferromagnetic random access memory according to the second embodiment. First, with reference to FIGS. 8 and 9, description will be given of the case in which the memory cell MC1, which is the first from the left end (the side of the block B1 connected to the bit line BL1) of the block B1, is accessed. FIG. 8 is a diagram showing the potentials of main parts obtained when the memory cell MC1 is accessed. FIG. 9 is a diagram schematically showing the state in which the memory cell MC1 is accessed. As shown in FIGS. 7 and 8, in the standby state, the word lines WL1 to WL8 and the signal lines WLC1 and WLC2 are at the potential VPP. The block selection lines BS1 and BS2 are at the potential VSS. The plate line PL1 and the bit line BL1 are at the potential VSS. The signal SA controlling the sense amplifier SA is at the low level.

When the memory cell MC1 is accessed, only the word line WL1 among the word lines WL1 to WL8 is set at the potential VSS. Further, among the signal line WLC5 to WLC8, only the signal line WLC5 of the switch transistor TC5, which is the first from the left end (the side of the block B2 connected to the plate line PL1) of the block B2, is set at the potential VSS. The block selection line BS1 of the block B1, including the memory cell MC1, is set at the potential VPP. The block selection line BS2 remains at the potential VSS. As a result, in the block B1, only the cell transistor T1 is turned off, and the other cell transistors T2 to T4 and the switch transistors TC1 to TC4 remain on. Thus, one end of the ferromagnetic capacitor M1 is electrically connected to the bit line BL1. The other end of the ferromagnetic capacitor M1 is electrically connected to the plate line PL1. Further, in the block B2, the memory cells MC5 to MC8 are disconnected from the plate line PL1. This is shown in FIG. 9.

As shown in FIG. 9, the capacitance of the seven transistors T2 to T4 and TC1 to TC4 is added to the plate line PL1 (as shown by the transistors drawn with thick lines). In this state, as in the case of the first embodiment, the plate line PL1 and the sense amplifier SA are driven. Once amplification by the sense amplifier is finished, the plate line PL1 is set at the potential VSS. Subsequently, the word line WL1 and the signal line WLC5 are set at the potential VPP. The block selection line BS1 is set at the potential VSS. The memory thus shifts to the standby state.

Figure 10:
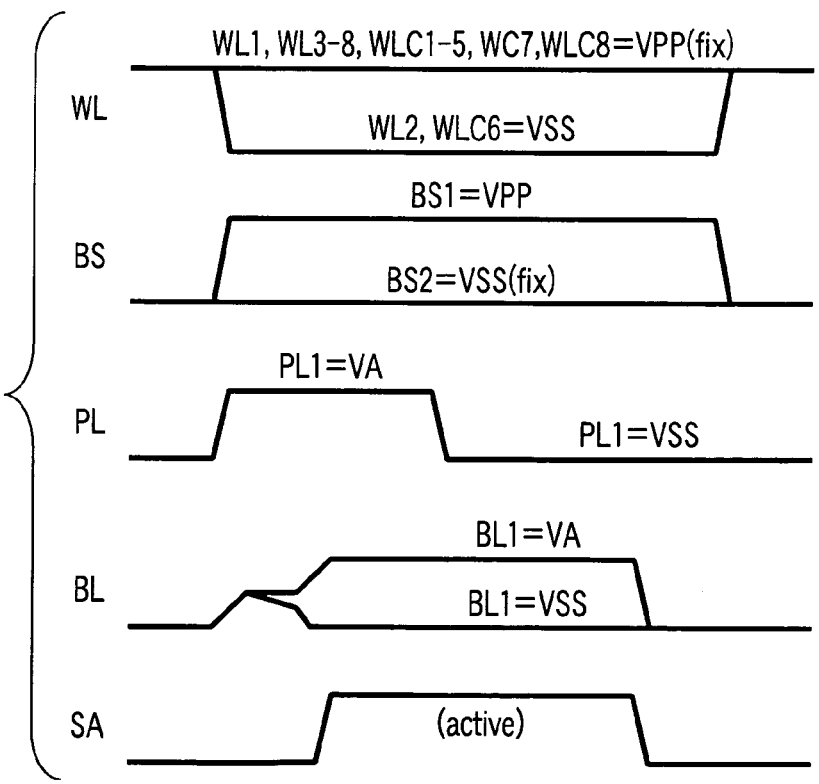
FIG. 10 is a diagram showing the potentials of main parts obtained when a memory cell MC2 of the ferromagnetic random access memory according to the second embodiment is accessed.
Figure 11:
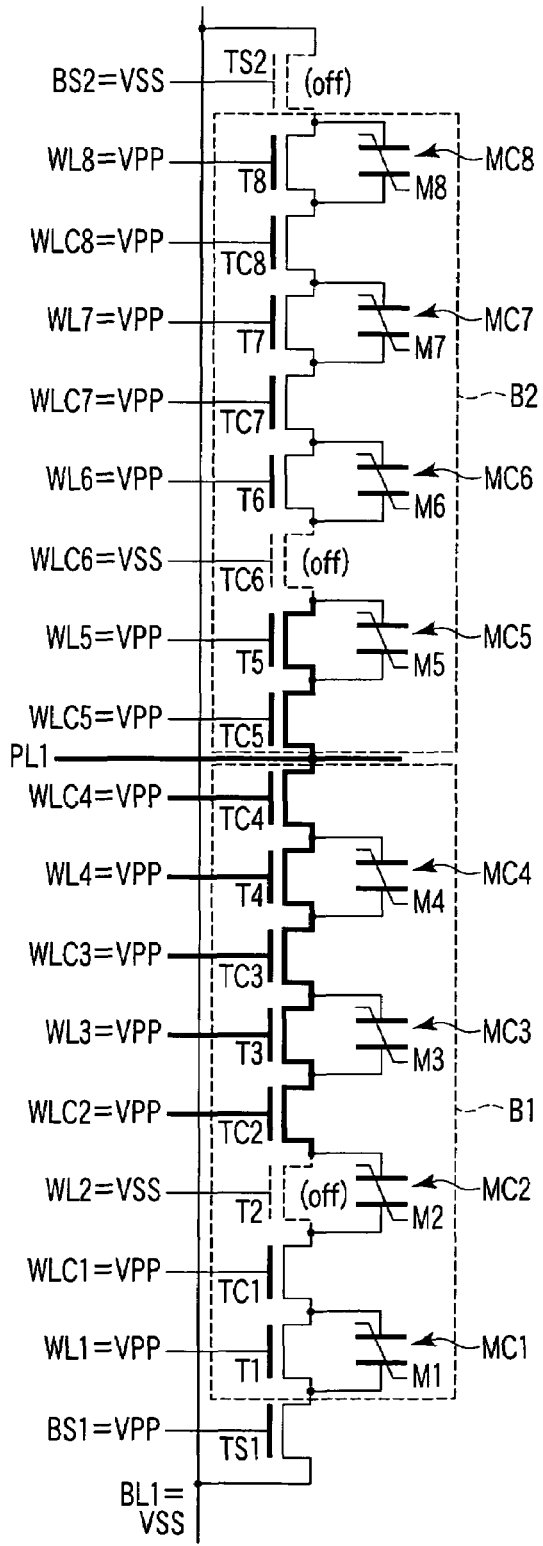
FIG. 11 is a diagram showing a state observed when the memory cell MC2 of the ferromagnetic random access memory according to the second embodiment is accessed.

With reference to FIGS. 10 and 11, description will be given of the case in which the memory cell MC2, which is second from the left end of the block B1, is accessed. FIG. 10 is a diagram showing the potentials of main parts obtained when the memory cell MC2 is accessed. FIG. 11 is a diagram schematically showing the state in which the memory cell MC2 is accessed.

When the memory cell MC2 is accessed, the word line WL2 is set at the potential VSS. Further, the signal line WLC6 of the switch transistor TC6, which is the second from the left end of the block B2, is set at the potential VSS. The other potentials are the same as in FIG. 8. As a result, in the block B1, only the cell transistor T2 is turned off, and the other cell transistors T1, T3, and T4 and the switch transistors TC1 to TC4 remain on. In this state, when the block selection transistor TS1 is turned on, one end of the ferromagnetic capacitor MC2 is electrically connected to the bit line BL1. The other end of the ferromagnetic capacitor MC2 is electrically connected to the plate line PL1. Further, in the block B2, the memory cells MC6 to MC8 are disconnected from the plate line PL1. This is shown in FIG. 11. As shown in FIG. 11, the capacitance of the seven transistors T3 to T5 and TC2 to TC5 is added to the plate line PL1 (as shown by the transistors drawn with thick lines). Subsequently, the plate line PL1 is driven and the sense amplifier SA executes amplification to shift the memory to the standby state.

Figure 12:
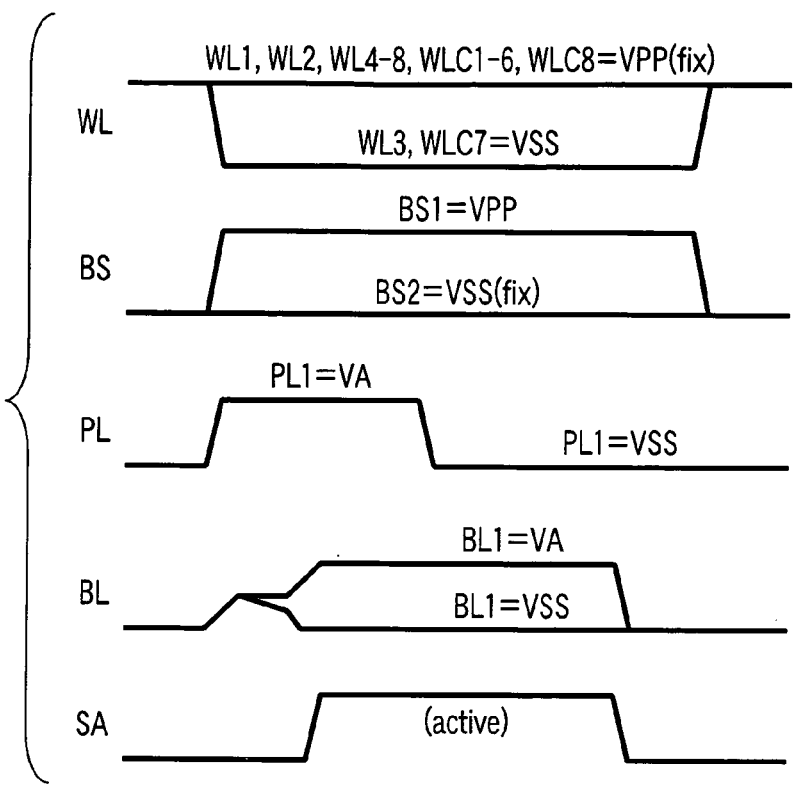
FIG. 12 is a diagram showing the potentials of main parts obtained when a memory cell MC3 of the ferromagnetic random access memory according to the second embodiment is accessed.
Figure 13:
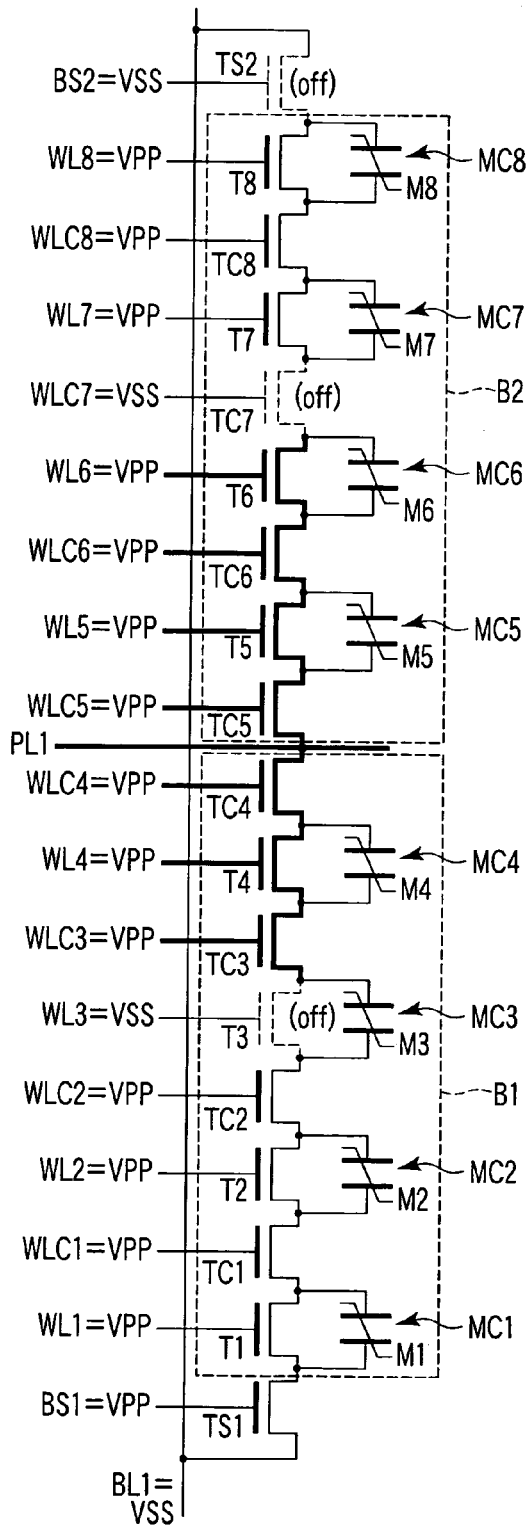
FIG. 13 is a diagram showing a state observed when the memory cell MC3 of the ferromagnetic random access memory according to the second embodiment is accessed.

With reference to FIGS. 12 and 13, description will be given of the case in which the memory cell MC3, which is the third from the left end of the block B1, is accessed. FIG. 12 is a diagram showing the potentials of main parts obtained when the memory cell MC3 is accessed. FIG. 13 is a diagram schematically showing the state in which the memory cell MC3 is accessed.

When the memory cell MC3 is accessed, the word line WL3 is set at the potential VSS. Further, only the signal line WLC7 of the switch transistor TC7, which is the third from the left end of the block B2, is set at the potential VSS. The other potentials are the same as in FIG. 8. As a result, in the block B1, only the cell transistor T3 is turned off, and the other cell transistors T1, T2, and T4 and the switch transistors TC1 to TC4 remain on. In this state, when the block selection transistor TS1 is turned on, one end of the ferromagnetic capacitor MC3 is electrically connected to the bit line BL1. The other end of the ferromagnetic capacitor MC3 is electrically connected to the plate line PL1. Further, in the block B2, the memory cells MC7 and MC8 are disconnected from the plate line PL1. This is shown in FIG. 13. As shown in FIG. 13, the capacitance of the seven transistors T4 to T6 and TC3 to TC6 is added to the plate line PL1 (as shown by the transistors drawn with thick lines). Subsequently, the plate line PL1 is driven and the sense amplifier SA executes amplification to shift the memory to the standby state.

Figure 14:
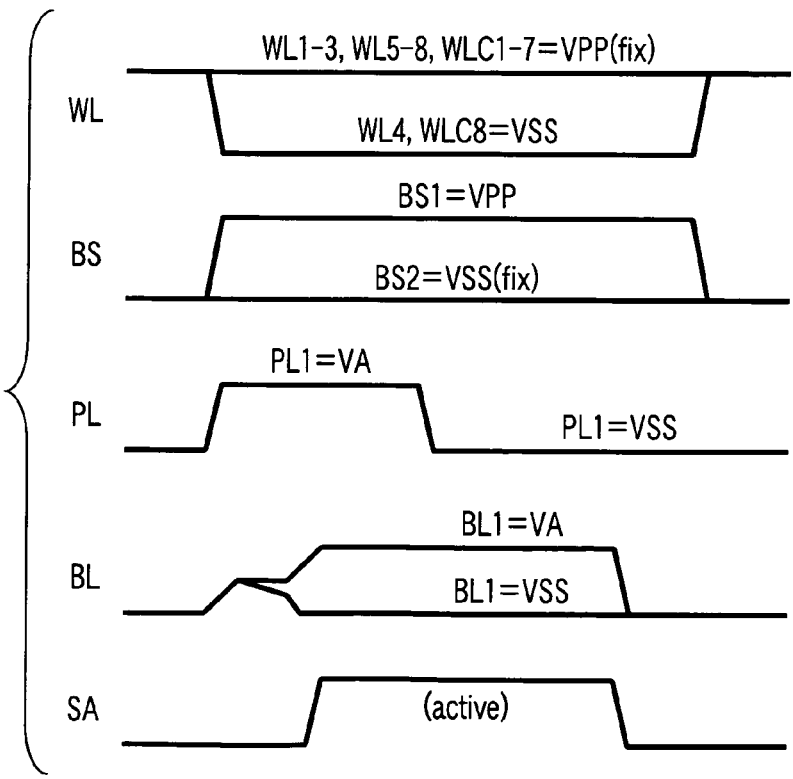
FIG. 14 is a diagram showing the potentials of main parts obtained when a memory cell MC4 of the ferromagnetic random access memory according to the second embodiment is accessed.
Figure 15:
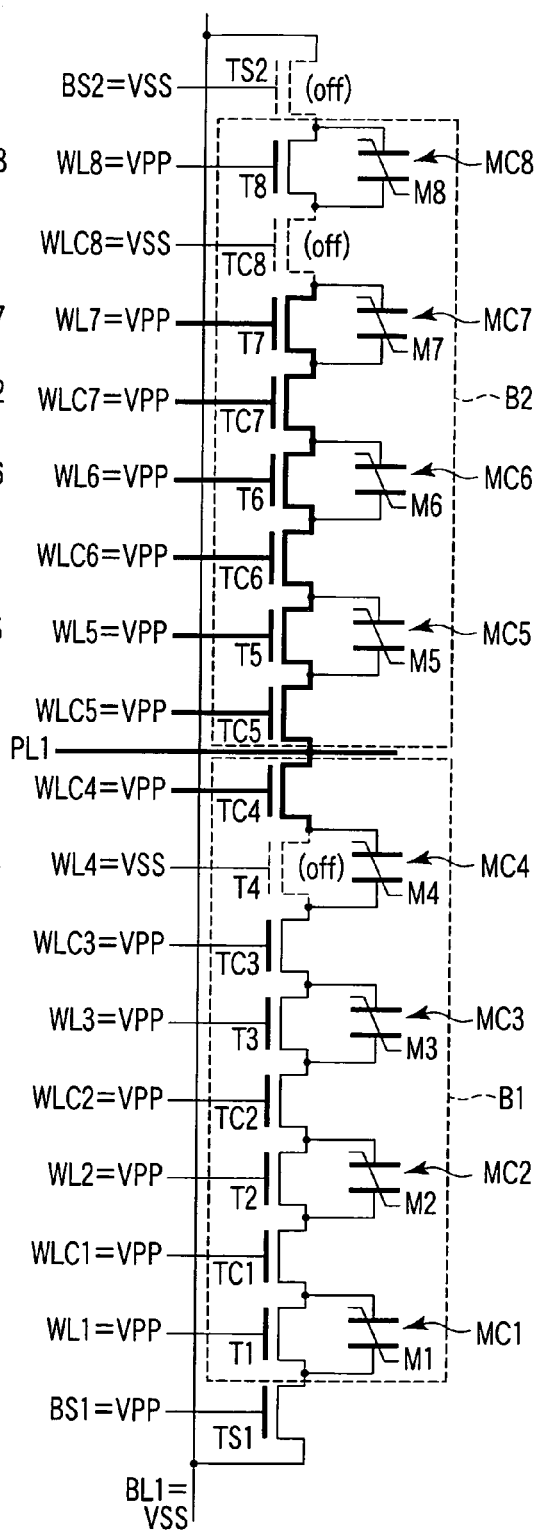
FIG. 15 is a diagram showing a state observed when the memory cell MC4 of the ferromagnetic random access memory according to the second embodiment is accessed.

With reference to FIGS. 14 and 15, description will be given of the case in which the memory cell MC4, which is the fourth from the left end of the block B1, is accessed. FIG. 14 is a diagram showing the potentials of main parts obtained when the memory cell MC4 is accessed. FIG. 15 is a diagram schematically showing the state in which the memory cell MC4 is accessed.

When the memory cell MC4 is accessed, the word line WL4 is set at the potential VSS. Further, only the signal line WLC8 of the switch transistor TC8, which is the fourth from the left end of the block B2, is set at the potential VSS. The other potentials are the same as in FIG. 8. As a result, in the block B1, only the cell transistor T4 is turned off, and the other cell transistors T1 to T3 and the switch transistors TC1 to TC4 remain on. In this state, when the block selection transistor TS1 is turned on, one end of the ferromagnetic capacitor MC4 is electrically connected to the bit line BL1. The other end of the ferromagnetic capacitor MC4 is electrically connected to the plate line PL1. Further, in the block B2, the memory cell MC8 is disconnected from the plate line PL1. This is shown in FIG. 15. As shown in FIG. 15, the capacitance of the seven transistors T5 to T7 and TC4 to TC7 is added to the plate line PL1 (as shown by the transistors drawn with thick lines). Subsequently, the plate line PL1 is driven and the sense amplifier SA executes amplification to shift the memory to the standby state.

As described above, the number of transistors connected to the plate line PL1 is fixed regardless of the memory cell in the block B1 to be accessed. In the above example, the transistors T and TC that are turned on are counted from the left end of the block. However, the results are obtained even if these transistors are counted from the right end of the block. Further, the memory cell MC in the block B2 may be accessed in the same manner as in the above description.

[2-3] Effects

In the ferromagnetic random access memory according to the second embodiment of the present invention, the blocks B1 and B2 connected to the same plate line PL have the same number of memory cells MC. In the blocks B1 and B2, as many switch transistors TC as the memory cells MC are alternately connected in series with the memory cells MC. Then, when the x-th memory cell MC from the left end (or right end) of the block B is accessed, the x-th switch transistor TC from the left end (right end) of the other block B is turned off. Thus, the number of transistors connected to the plate line PL, that is, the parasitic capacitance, is always fixed regardless of the position of the memory cell MC to be accessed. Consequently, the speed accomplished when the plate line PL is driven is fixed. This serves to provide a ferromagnetic random access memory having a reduced variation in access operation as well as a large operation margin.

(3) Third Embodiment

[3-1] Configuration

Figure 16:
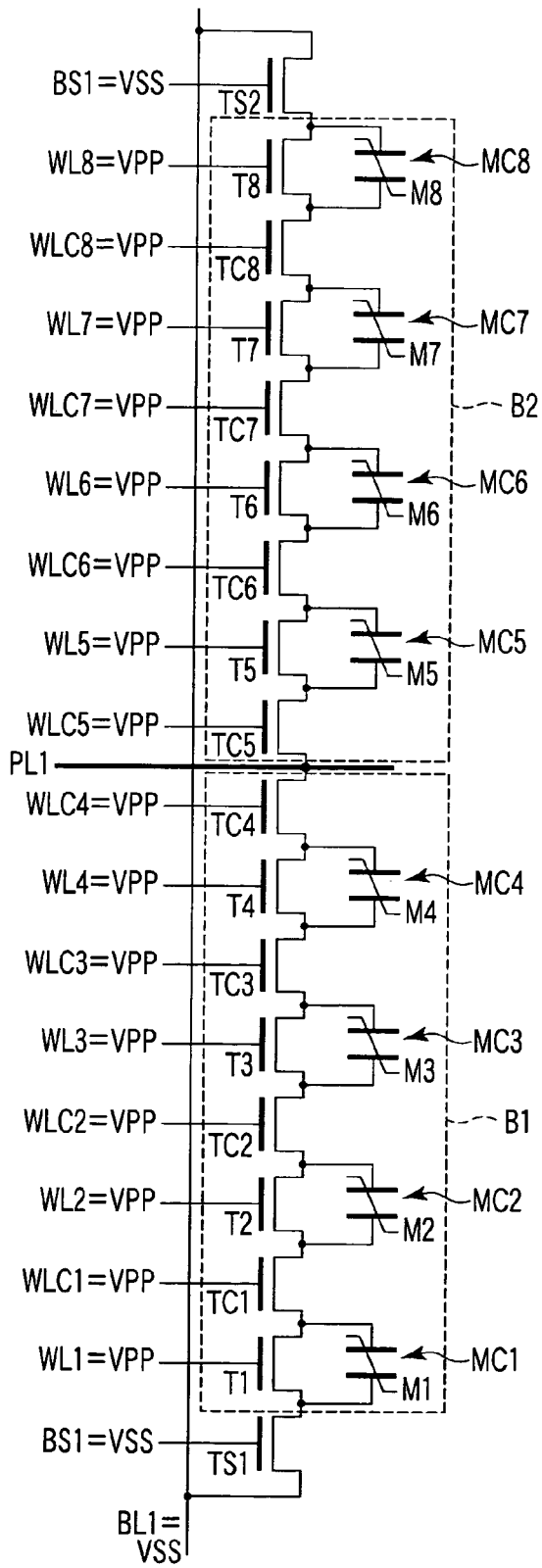
FIG. 16 is a diagram schematically showing a ferromagnetic random access memory according to a third embodiment of the present invention.

According to a third embodiment, in the configuration according to the second embodiment, the block selection transistors TS1 and TS2 are turned on when the memory cell MC is accessed. FIG. 16 is a diagram schematically showing a ferromagnetic random access memory according to the third embodiment of the present invention. As shown in FIG. 16, a common block selection signal BS1 is supplied the gates of the block selection transistors TS1 and TS2. The remaining part of the configuration is as described in the second embodiment.

Further, as described in the second embodiment, the positional relationship between the memory cell MC and switch transistor TC in the set of the memory cell MC and switch transistor TC may be reversed compared to FIG. 16. Moreover, the positional relationship between the memory cell MC and switch transistor TC may vary between the blocks B1 and B2. This configuration produces the same effects as those described later.

[3-2] Operation

Figure 18:
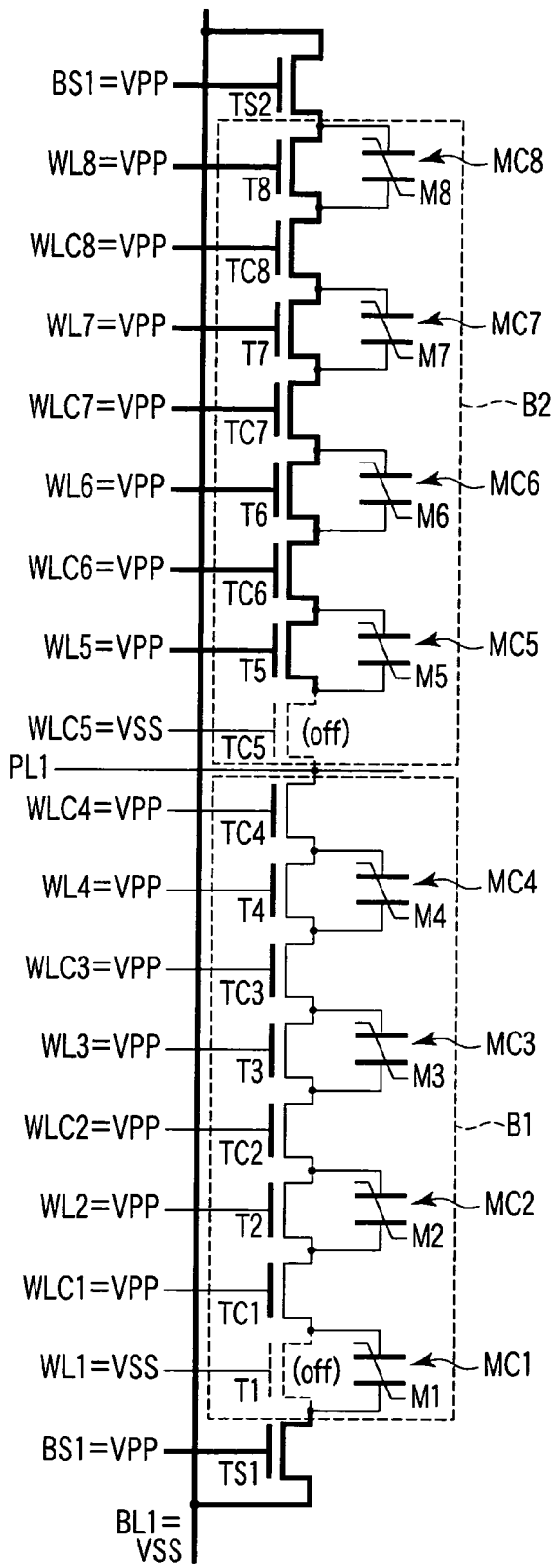
FIG. 18 is a diagram showing a state observed when the memory cell MC1 of the ferromagnetic random access memory according to the third embodiment is accessed.
Figure 17:
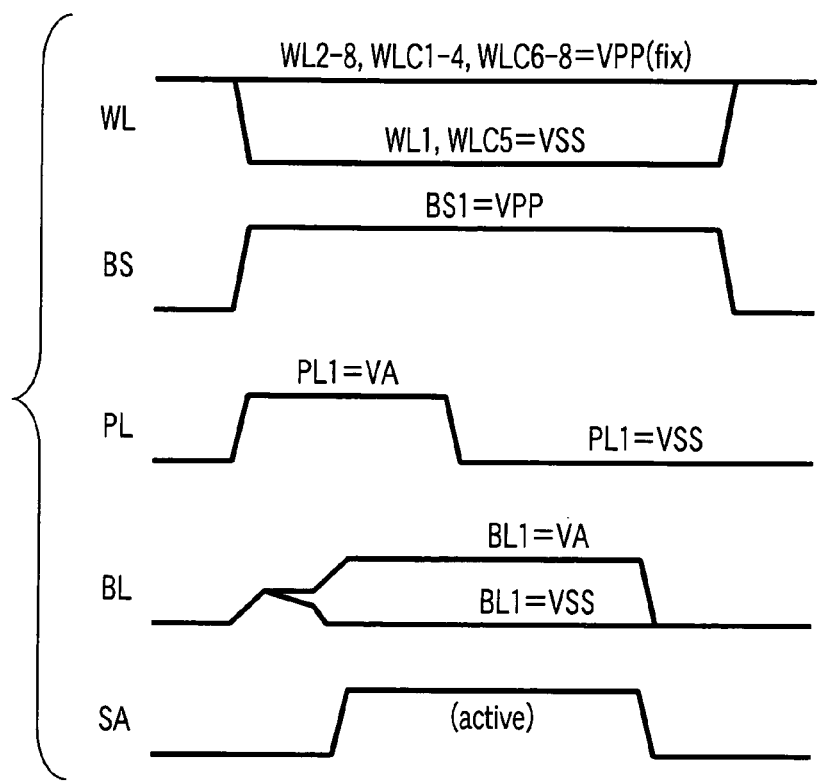
FIG. 17 is a diagram showing the potentials of main parts obtained when a memory cell MC1 of the ferromagnetic random access memory according to the third embodiment is accessed.

With reference to FIGS. 17 to 24, description will next be given of operations of the ferromagnetic random access memory according to the third embodiment. First, with reference to FIGS. 17 and 18, description will be given of the case in which the memory cell MC1, which is the first from the left end of the block B1, is accessed. FIG. 17 is a diagram showing the potentials of main parts obtained when the memory cell MC1 is accessed. FIG. 18 is a diagram schematically showing the state in which the memory cell MC1 is accessed. In the standby state, the block selection signal BS1 of the potential VSS is supplied to the gates of the block selection transistors TS1 and TS2, as in the case of the second embodiment.

When the memory cell MC1 is accessed, operations almost the same as those in the second embodiment are performed. That is, only the word line WL1 of the memory cell MC1, which is the first from the left end of the block B1, and the signal line WLC5 of the switch transistor TC5, which is the first from the left end of the block B1, are set at the potential VSS. As a result, in the block B1, only the cell transistor T1 is turned off, and the other cell transistors T2 to T4 and the switch transistors TC1 to TC4 remain on. Further, in the block B2, the memory cells MC5 to MC8 are disconnected from the plate line PL1. Then, the block selection signal BS1 is set at the potential VPP to turn on the block selection transistors TS1 and TS2. As a result, one and the other ends of the ferromagnetic capacitor M1 are electrically connected to the bit line BL1 and the plate line PL1. One end of the memory cell MC8 is electrically connected to the bit line BL1. This is shown in FIG. 18.

As shown in FIG. 18, the capacitance of the seven transistors T2 to T4 and TC1 to TC4 is added to the plate line PL1. Further, the capacitance of the nine transistors T5 to T8, TC6 to TC8, TS1, and TS2 is added to the bit line BL1 (as shown by the transistors drawn with thick lines). Subsequently, as in the case of the second embodiment, the plate line PL1 is driven and the sense amplifier SA executes amplification to shift the memory to the standby state.

Figure 19:
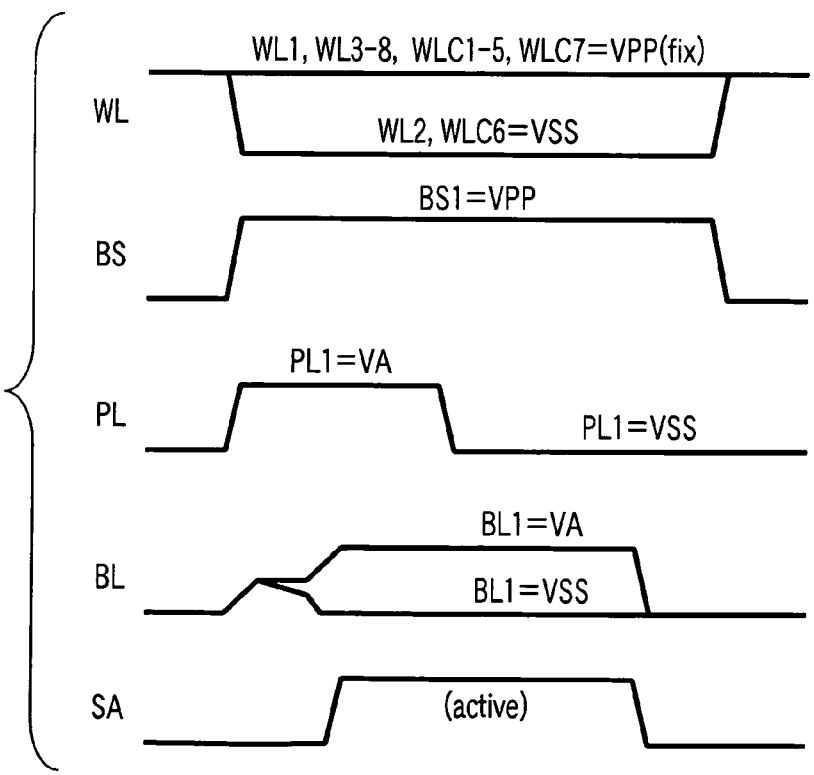
FIG. 19 is a diagram showing the potentials of main parts obtained when a memory cell MC2 of the ferromagnetic random access memory according to the third embodiment is accessed.

Operations performed to access the memory cells MC2, MC3, and MC4 are the same as in the second embodiment except that the block selection transistors TS1 and TS2 are turned on. FIGS. 19, 21, and 23 are diagrams showing the potentials of main parts obtained when the memory cells MC2, MC3, and MC4, respectively, are accessed. FIGS. 20, 22, and 24 are diagrams showing the state in which the memory cells MC2, MC3, and MC4, respectively, are accessed.

When the memory cell MC2 is accessed, the cell transistor T2 and the switch transistor TC6 are turned off, with the block selection transistors TS1 and TS2 turned on, as shown in FIGS. 19 and 20. As a result, the capacitance of the seven transistors T3 to T5 and TC2 to TC5 is added to the plate line PL1. Further, the capacitance of the nine transistors T1, T6 to T8, TC1, TC7, TC8, TS1, and TS2 is added to the bit line BL1 (as shown by the transistors drawn with thick lines).

When the memory cell MC3 is accessed, the cell transistor T3 and the switch transistor TC7 are turned off, with the block selection transistors TS1 and TS2 turned on, as shown in FIGS. 21 and 22. As a result, the capacitance of the seven transistors T4 to T6 and TC3 to TC6 is added to the plate line PL1. Further, the capacitance of the nine transistors T1, T2, T7,. T8, TC1, TC2, TC8, TS1, and TS2 is added to the bit line BL1 (as shown by the transistors drawn with thick lines).

When the memory cell MC4 is accessed, the cell transistor T4 and the switch transistor TC8 are turned off, with the block selection transistors TS1 and TS2 turned on, as shown in FIGS. 23 and 24. As a result, the capacitance of the seven transistors T5 to T7 and TC4 to TC7 is added to the plate line PL1. Further, the capacitance of the nine transistors T1 to T3, T8, TC1 to TC3, TS1, and TS2 is added to the bit line BL1 (as shown by the transistors drawn with thick lines).

As described above, the number of transistors connected to the plate line PL and the number of transistors connected to the bit line BL are fixed regardless of the position of the memory cell MC in the block B1 to be accessed. This also applies to accesses to the memory cell MC in the block B2.

[3-3] Effects

In the ferromagnetic random access memory according to the third embodiment of the present invention, the number of transistors connected to the plate line PL, that is, the parasitic capacitance, is always fixed regardless of the position of the memory cell MC to be accessed. This serves to provide a ferromagnetic random access memory having a large operation margin, as in the second embodiment.

Further, in the ferromagnetic random access memory according to the third embodiment of the present invention, the block selection transistors TS1 and TS2, connected to the same plate line PL, are controlled by the same signal. Thus, the block B not including the memory cell MC to be accessed is also connected to the bit line BL1. The number of transistors connected to the bit line BL1 is fixed, that is, the parasitic capacitance is always fixed. Thus, if the memory cells MC are assumed to have the same polarization information, the potential read onto the bit line BL does not vary depending on the position of the memory cell MC. This serves to provide a ferromagnetic random access memory having a reduced variation in read voltage as well as a large operation margin.

(4) Fourth Embodiment

A fourth embodiment is a variation of the second and third embodiments in which the switch transistor TC is inserted for every two memory cells MC. FIG. 25 is a diagram schematically showing a ferromagnetic random access memory according to a fourth embodiment. As shown in FIG. 25, in the block B1, the switch transistor TC1 is connected between the memory cells MC1 and MC2. The switch transistor TC2 is connected between the memory cells MC3 and MC4. In the block B2, the switch transistor TC3 is connected between the memory cells MC5 and MC6. The switch transistor TC4 is connected between the memory cells MC7 and MC8. The remaining part of the configuration is the same as in the second embodiment. The block selection signal BS may vary between the block selection transistors TS1 and TS2 or may be common to these transistors TS1 and TS2. The use of the common block selection signal BS1 is effective in maintaining the fixed parasitic capacitance of the bit line BL1 as in the case of the third embodiment.

Operations are similar to those of the second and third embodiments. Differences will be described below. For example, when the memory cell MC1 is accessed, the switch transistor TC3 is turned off. When the memory cells MC2, MC3, and MC4 are accessed, the switch transistor TC4 is turned off. Since the switch transistor TC is not provided for each memory cell MC, the number of transistors connected to the plate line PL1 or bit line BL1 varies by one or two depending on the position of the memory cell MC to be accessed. However, such a difference in parasitic capacitance is negligibly small. Accordingly, the present embodiment is particularly efficient in giving priority to a reduction in the number of switch transistors TC.

According to the fourth embodiment of the present invention, in the block B, the switch transistor is provided for every two memory cells MC. Thus, as in the case of the second embodiment, a fixed parasitic capacitance can be added to the plate line PL1 regardless of the position of the memory cell MC to be accessed. Further, by using the block selection signal common to the block selection signals TS1 and TS2, it is possible to allow a substantially fixed capacitance to be added to the bit line BL regardless of the position of the memory cell MC to be accessed, as in the case of the third embodiment.

(5) Fifth Embodiment

Figure 26:
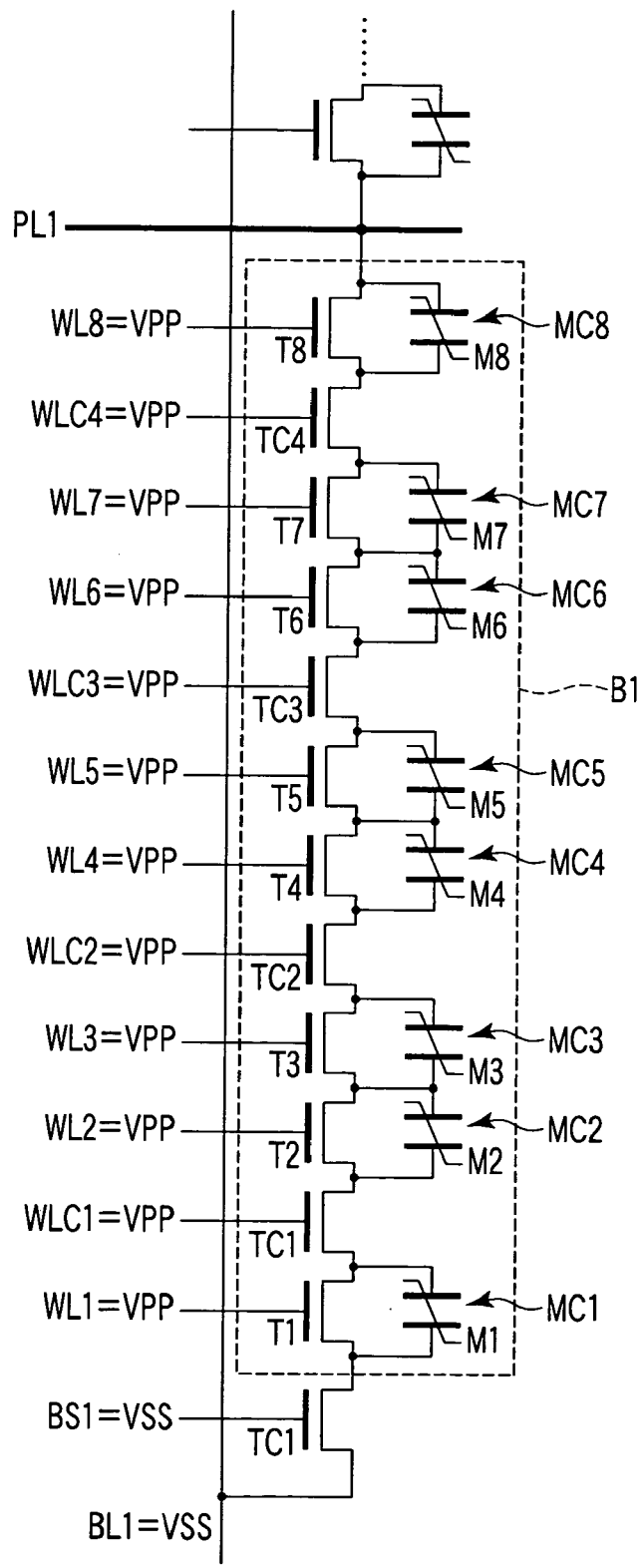
FIG. 26 is a diagram schematically showing a ferromagnetic random access memory according to a fifth embodiment of the present invention.

In the description of the first to fourth embodiments, the block B has four memory cells MC. However, it is of course possible to use a different number of memory cells MC. FIG. 26 is a diagram schematically showing a ferromagnetic random access memory according to a fifth embodiment of the present invention. FIG. 26 shows an example in which the block B has eight memory cells MC1 to MC8 and in which each of the switch transistors TC1 to TC2 is provided for every two memory cells MC, as in the case of the fourth embodiment. The number of memory cells may be 16, 32, or typically the n-th power of 2. This also applies to the case in which the present embodiment is applied to the second or third embodiment.

Operations are also the same as the fourth embodiment. That is, the cell transistors T of the memory cells MC other than the one to be accessed remain on. When the present embodiment is applied to the first embodiment, the switch transistors TC in the block different from that including the memory cell MC to be accessed are turned off. When applied to the second, third, and fourth embodiments, particular switch transistors TC are turned off so as to allow the fixed or substantially fixed number of transistors to be connected to the plate line PL and bit line BL. A designer can appropriately select the number of memory cells MC depending on an operation speed or a bit line capacitance, so as to provide an optimum design.

The ferromagnetic random access memory according to the fifth embodiment of the present invention produces the same effects as in the first to fourth embodiments.

(6) Sixth Embodiment

[6-1] Configuration

Figure 27:
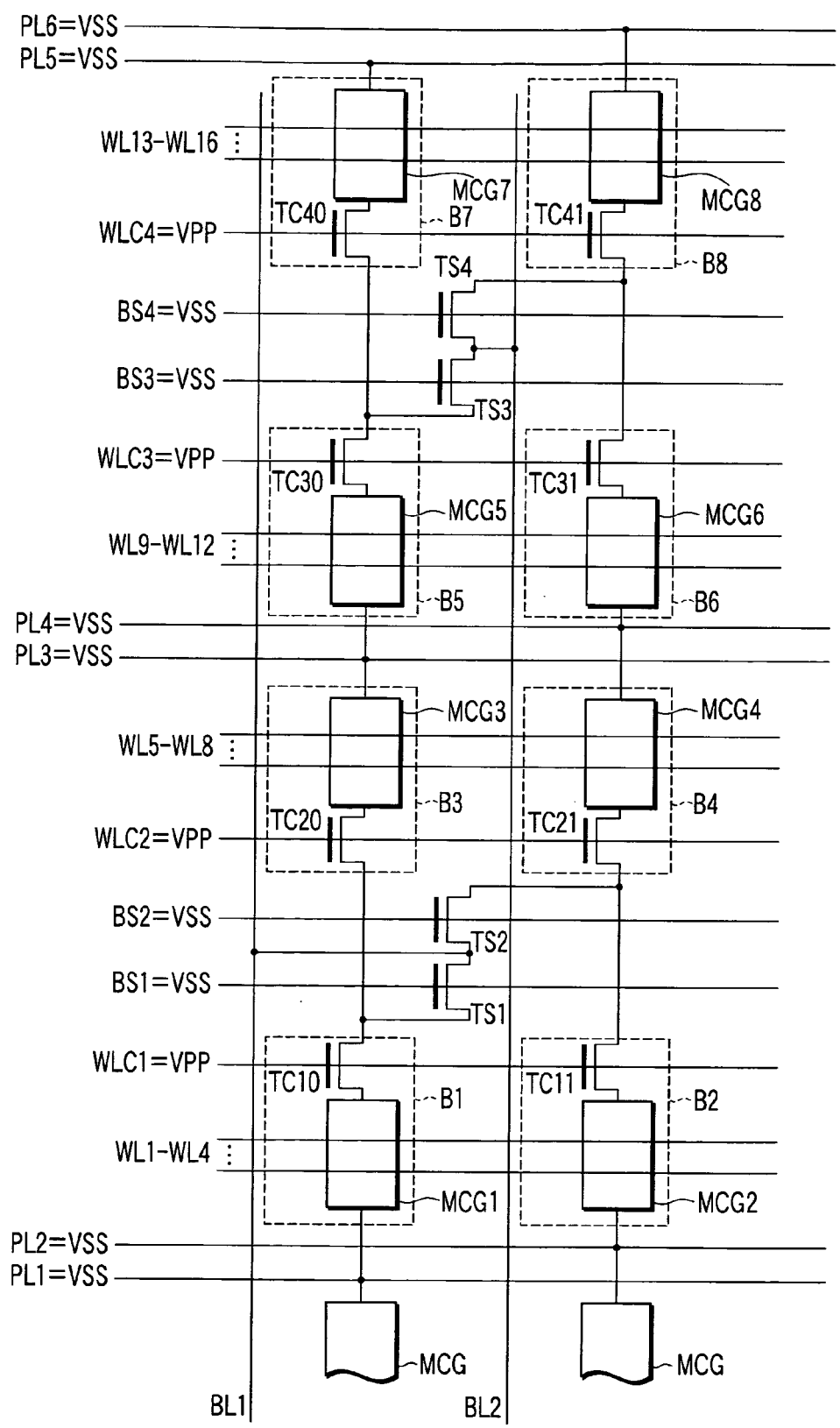
FIG. 27 is a diagram schematically showing a ferromagnetic random access memory according to a sixth embodiment of the present invention.
Figure 28:
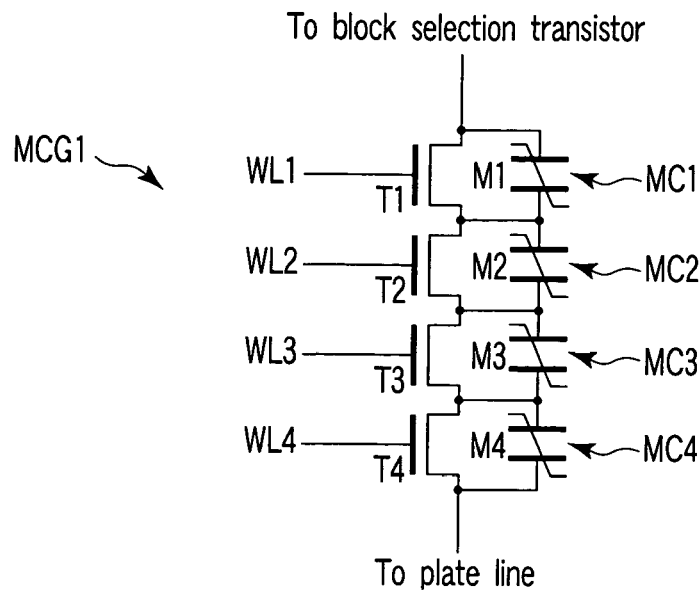
FIG. 28 is a diagram illustrating the configuration of a block according to the sixth embodiment of the present invention.

A sixth embodiment relates to the connection between the block selection transistor TS and the bit line BL. FIG. 27 is a diagram schematically showing a ferromagnetic random access memory according to the sixth embodiment of the present invention. As shown in FIG. 27, a plurality of blocks B1 to B8 are provided. Each of the blocks B1 to B8 is composed of a memory cell group MCG and the switch transistor TC connected in series. The memory cell group MCG is composed of, for example, four memory cells MC connected in series as shown in FIG. 28. FIG. 28 shows a memory cell group MCG1 as a typical configuration. The memory cell group may be composed of, for example, eight or sixteen memory cells MC as shown in the fifth embodiment. In any case, as shown in FIG. 27, the same word line WL is connected to the gates of the cell transistors T of the memory cells MC belonging to the same column. That is, for example, the same word line WL is connected to the leftmost cell transistors in the blocks B1 and B2.

One end of the memory cell group MCG1 is connected to the plate line PL1. One end of a memory cell group MCG2 is connected to the plate line PL2. One end of each of memory cell groups MCG3 and MCG5 is connected to a plate line PL3. One end of each of memory cell groups MCG4 and MCG6 is connected to a plate line PL4.

The other end of the memory cell group MCG1 is connected to one end of the block selection transistor TS1 via a switch transistor TC10. The other end of the memory cell group MCG3 is connected to one end of the block selection transistor TS1 via a switch transistor TC20. The other end of the memory cell group MCG2 is connected to one end of the block selection transistor TS2 via a switch transistor TC11. The other end of the memory cell group MCG4 is connected to one end of the block selection transistor TS2 via a switch transistor TC21. The other ends of the block selection transistors TS1 and TS2 are connected together. This connection node is connected to the bit line BL1. Accordingly, for the four blocks, only two block selection transistors TS are connected to the bit line BL1.

The other end of the memory cell group MCG5 is connected to one end of the block selection transistor TS3 via a switch transistor TC30. The other end of the memory cell group MCG7 is connected to one end of the block selection transistor TS3 via a switch transistor TC40. The other end of the memory cell group MCG6 is connected to one end of a block selection transistor TS4 via a switch transistor TC31. The other end of the memory cell group MCG8 is connected to one end of the block selection transistor TS4 via a switch transistor TC41. Each of the other end of the block selection transistors TS3 and TS4 are connected together. This connection node is connected to the bit line BL2. Accordingly, for the four blocks, only two block selection transistors TS are connected to the bit line BL2.

The same signal line WLC is connected to the gates of the switch transistors TC belonging to the same column. Specifically, the signal line WLC1 is connected to the gates of the switch transistors TC10 and TC11. The signal line WLC2 is connected to the gates of the switch transistors TC20 and TC21. The signal line WLC3 is connected to the gates of the switch transistors TC30 and TC31. The signal line WLC4 is connected to the gates of the switch transistors TC40 and TC41.

[6-2] Operation

Figure 29:
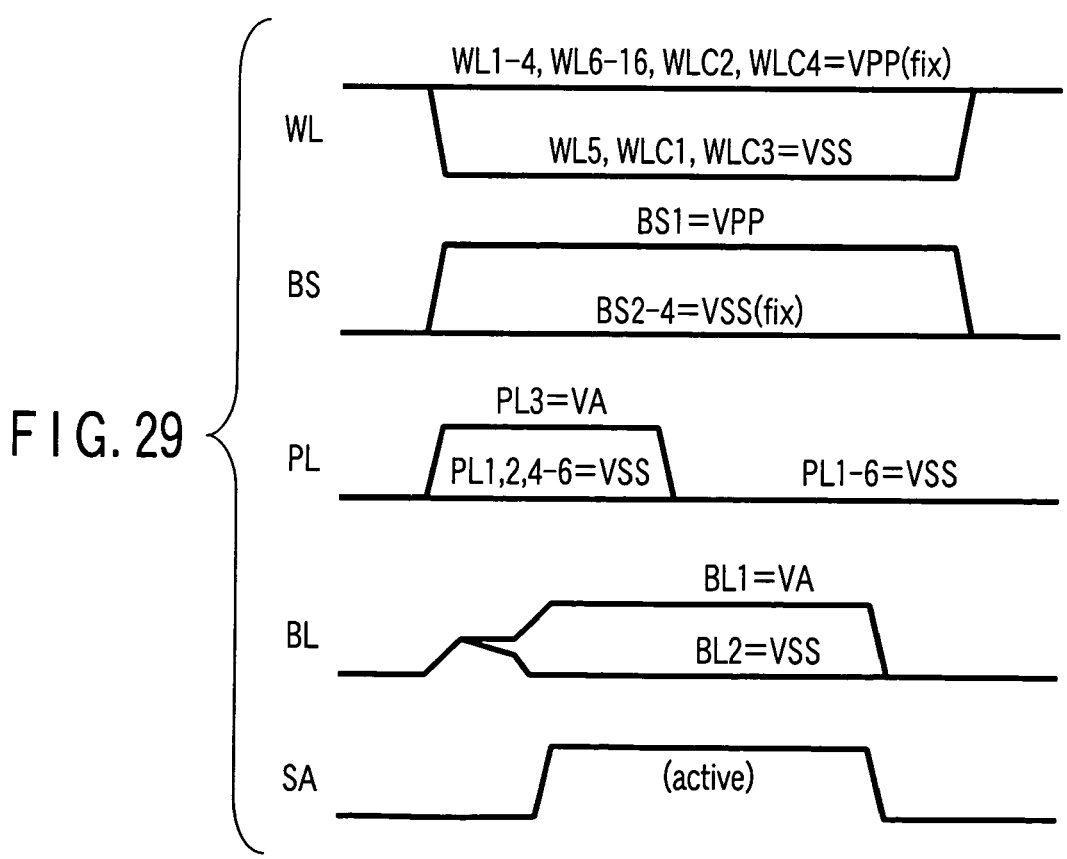
FIG. 29 is a diagram showing the potentials of main parts of the ferromagnetic random access memory according to the sixth embodiment.
Figure 30:
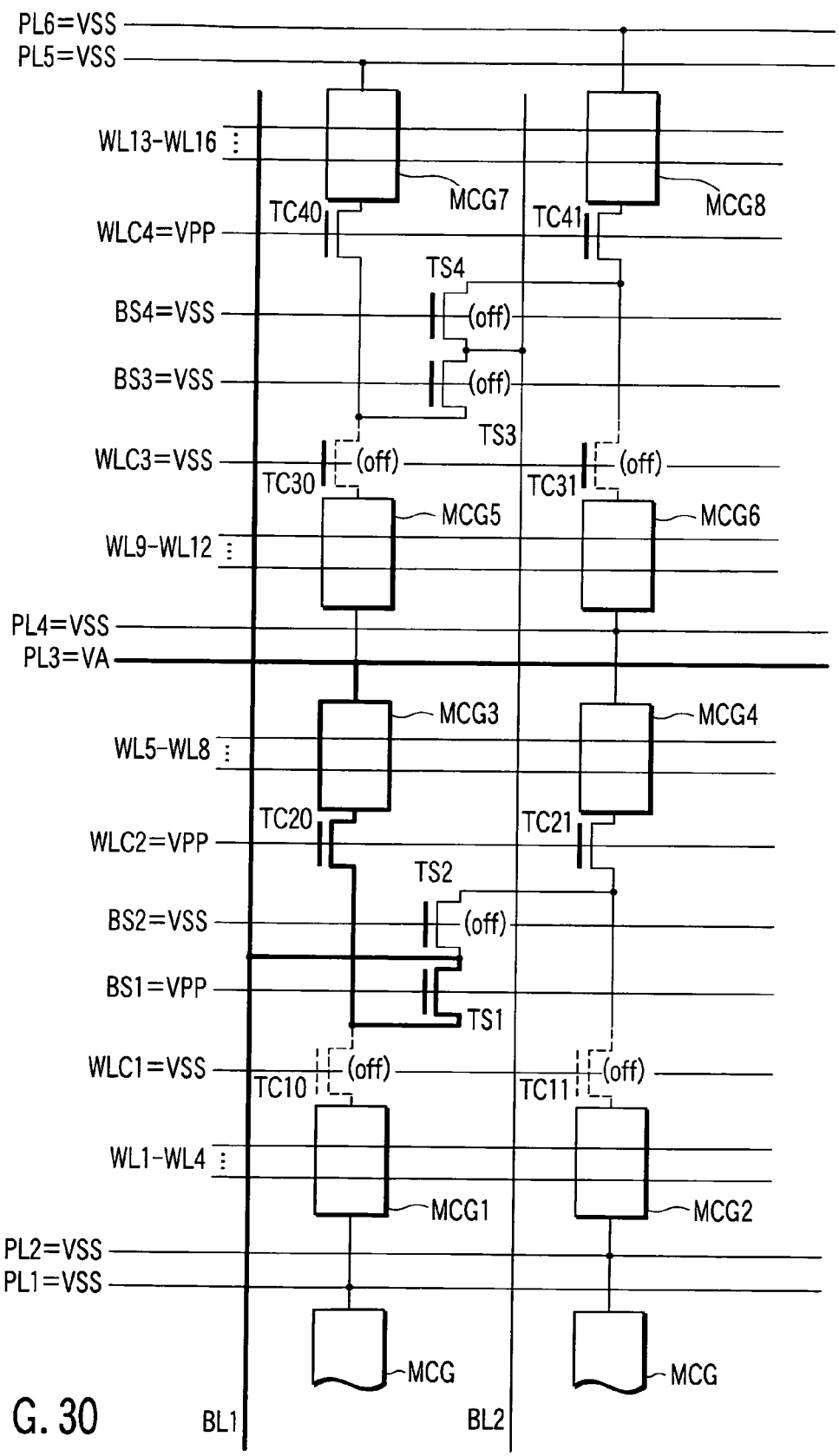
FIG. 30 is a diagram schematically showing a read state of the ferromagnetic random access memory according to the sixth embodiment.

Description will next be given below of operations of a ferromagnetic random access memory according to a sixth embodiment, taking, by way of example, a read from the memory cell MC5, which is the first from the left end of the block B3. FIG. 30 is a diagram showing a read state of the ferromagnetic random access memory in FIG. 27. As shown in FIGS. 27 and 29, in the standby state, word lines WL1 to WL16 and the signal lines WLC1 to WLC4 are at the potential VPP. Block selection lines BS1 to BS4 are at the potential VSS. Plate lines PL1 to PL6 are at the potential VSS, and the bit lines BL1 and BL2 are at the potential VSS. The signal SA controlling the sense amplifier SA is at the low level.

Then, upon a read, the word line WL5 connected to the memory cell MC5 to be subjected to the read is set at the potential VSS. Further, the potentials of the signal lines WLC1 and WLC3 passing through the blocks B different from the block B3 including the memory cell MC5 are set at the low level. The signal line WLC4 is maintained at the high level. Further, the block selection signal BS1 is set at the potential VPP. The block selection signals BS2 to BS4 are maintained at the low level. As a result, as shown in FIG. 30, a current path is formed which extends from the plate line PL3 through the ferromagnetic capacitor M5 of the memory cell MC5, the switch transistor TC20, and the block selection transistor TS1 to the bit line BL1.

Then, when the plate line PL3 is driven to the array potential VA, data stored in the ferromagnetic capacitor M5 of the memory cell MC5 is transferred to the bit line BL1. Then, the sense amplifier SA amplifies the reference potential read from a dummy cell (not shown) or the like onto the bit line BL2, and the potential on the bit line BL1. The memory then shifts to a standby state. Upon a read from a memory cell MC in the blocks B2 to B4, the read potential is also transferred to the bit line BL1. On the other hand, for the blocks B5 to B8, a potential is transferred to the bit line BL2. Since selections are not simultaneously made from the group of the blocks B1 to B4 and the group of the blocks B5 to B8, the bit lines BL1 and B12 can be used as a pair of complementary bit lines.

[6-3] Variation

Figure 31:
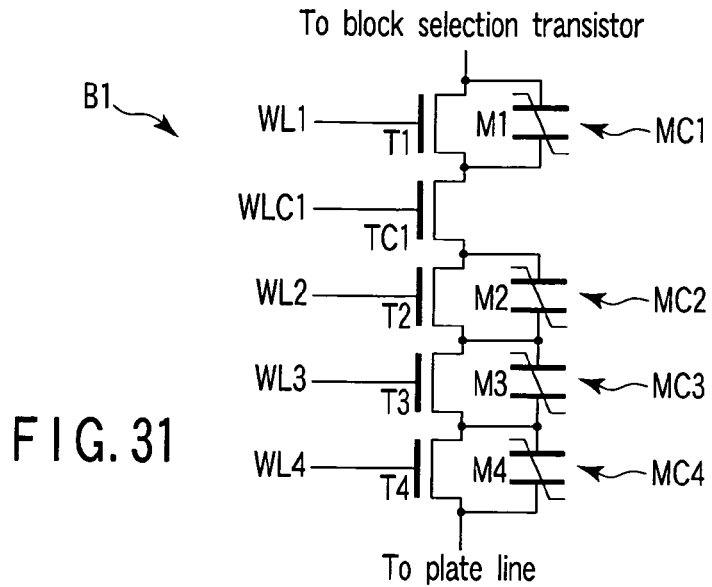
FIG. 31 is a diagram illustrating the configuration of a block according to the sixth embodiment of the present invention.

FIG. 31 is a diagram illustrating the configuration of a block according to a variation of the sixth embodiment. FIG. 31 shows the block B1 as a typical configuration. As shown in this figure, the switch transistor TC is connected between the memory cell MC1, which is closest to the block selection transistor, and the memory cell MC2, which is second closest to the block selection transistor. Operations are the same as in FIG. 27.

[6-4] Effects

In the ferromagnetic random access memory according to the sixth embodiment of the present invention, the connection node of the two blocks B is connected to the bit line BL via one block selection transistor TS. In other words, the number of block selection resistors TS connected to the bit line BL is half the number of blocks B. Thus, compared to the case in which the block selection transistor TS is connected to the bit line BL in each block B, the junction capacity of a source/drain diffusion layer in the block selection transistor TS decreases. At the same time, one bit line contact is formed for every four blocks in the direction in which the bit line BL extends. Accordingly, the number of bit line contacts decreases compared to the prior art. Consequently, by securing a high potential from the ferromagnetic capacitor, it is possible to provide a ferromagnetic random access memory with a large read margin.

(7) Seventh Embodiment

[7-1] Configuration

Figure 33:
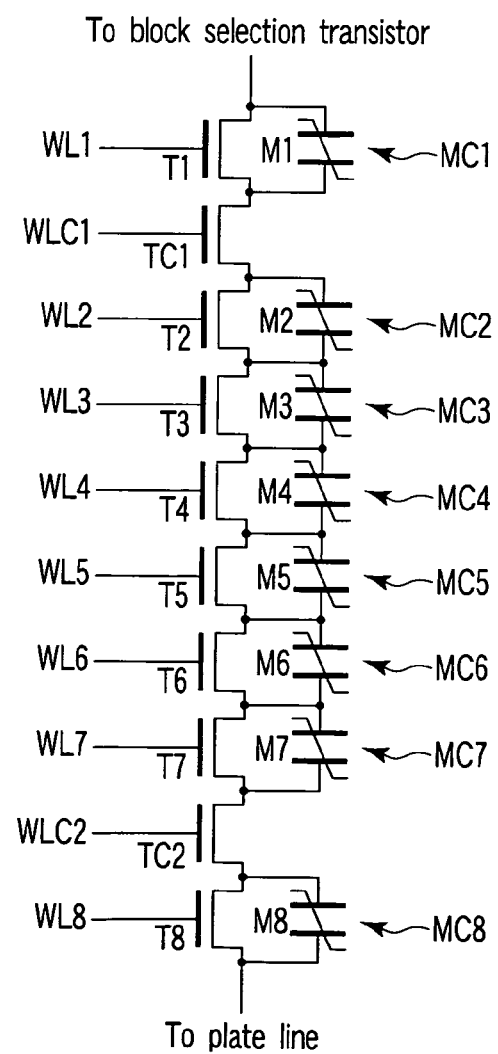
FIG. 33 is a diagram illustrating the configuration of a block according to a variation of the seventh embodiment of the present invention.
Figure 32:
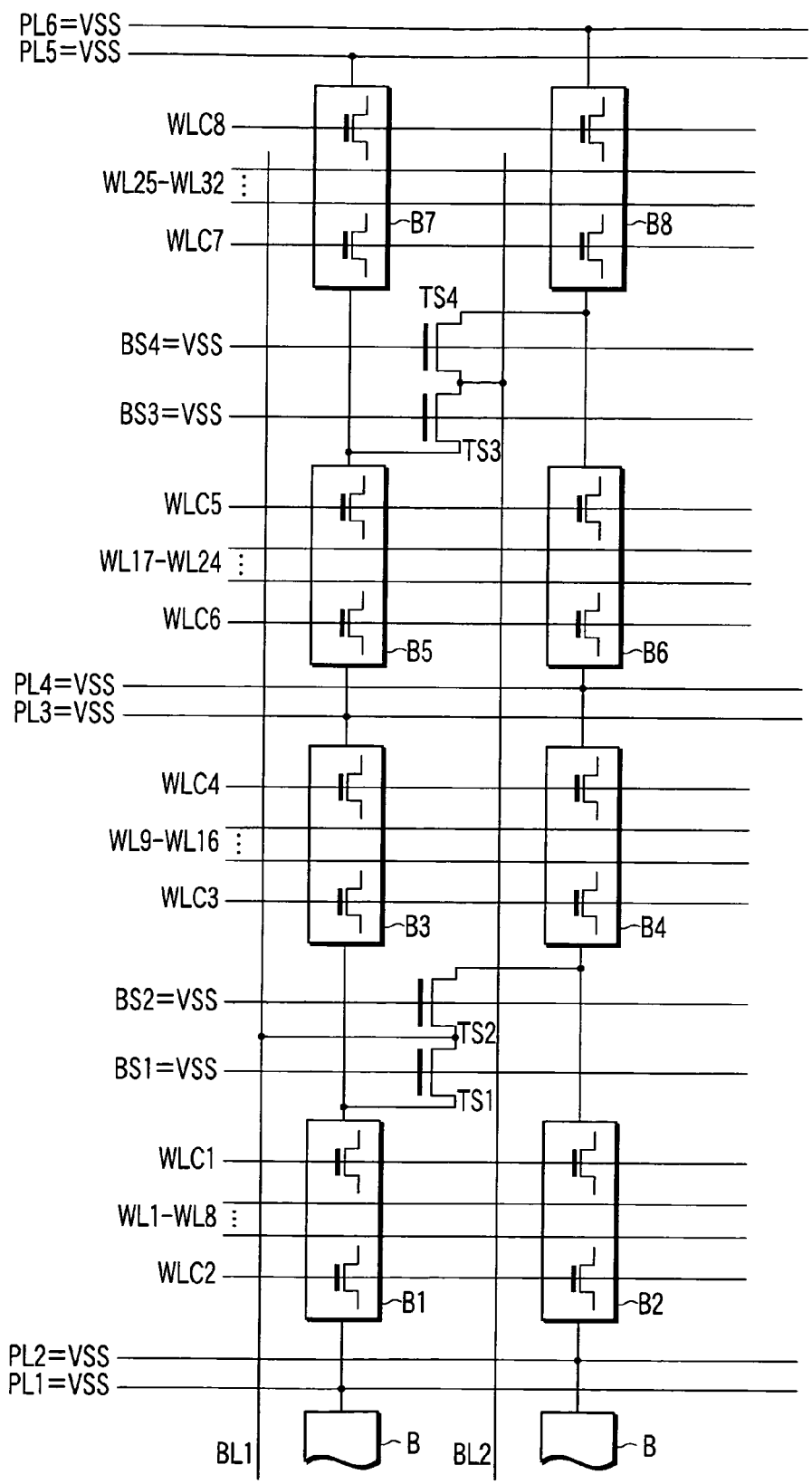
FIG. 32 is a diagram schematically showing a ferromagnetic random access memory according to a seventh embodiment of the present invention.

A seventh embodiment has not only the configuration of the sixth embodiment but also two switch transistors within one block B. FIG. 32 is a diagram schematically showing a ferromagnetic random access memory according to a seventh embodiment of the present invention. As shown in FIG. 33, each of blocks B1 to B8 is composed of, for example, eight memory cells MC1 to MC8 and two switch transistors TC1 and TC2. FIG. 33 shows the block B1 as a representative configuration. The switch transistor TC is provided between the first memory cell MC from the right end of the block and the second memory cell MC from the right end and between the first memory cell MC from the left end of the block and the second memory cell MC from the left end. The remaining part of the configuration is the same as in the sixth embodiment.

[7-2] Operation

Figure 34:
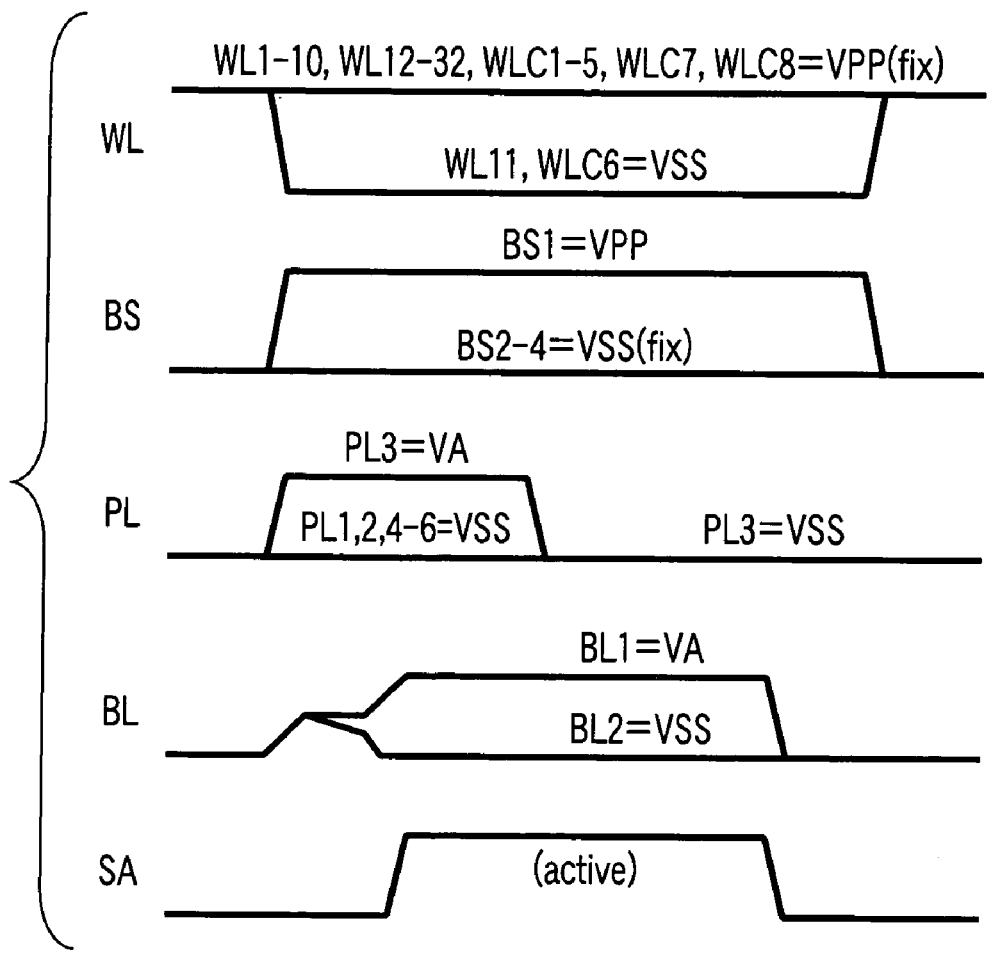
FIG. 34 is showing the potentials of main parts of the ferromagnetic random access memory according to the seventh embodiment during one read cycle.

Operations are also similar to those in the sixth embodiment. Description will be given below taking, by way of example, a read from the third memory cell MC11 from the left end of the block B3. FIG. 34 is a diagram showing the potentials of main parts of the ferromagnetic random access memory in FIG. 1, during one read cycle. As shown in FIG. 34, in the standby state, word lines WL1 to WL32 and the signal lines WLC1 and WLC8 are at the potential VPP. Further, the block selection lines BS1 to BS4 are at the ground potential VSS. Plate lines PL1 to PL6 are at the potential VSS, and the bit lines BL1 and BL2 are at the potential VSS. The signal SA controlling the sense amplifier SA is at the low level.

Then, upon a read, the word line WL11 connected to the memory cell MC11 to be subjected to the read is set at the potential VSS. Further, in the block B5 connected to the same plate line PL3 as the block B3 including the memory cell MC11, the signal line WLC6 of the switch transistor TC, which is closer to the plate line PL3, is set at the low level. As a result, in the block B5, the ferromagnetic capacitor M between the switch transistor TC is turned off and the bit line BL1 is disconnected from the plate line PL3. Then, the block selection signal BS1 is set at the potential VPP to form a current path extending from the plate line PL3 through the ferromagnetic capacitor M11 of the memory cell MC11, and the block selection transistor TS1 to the bit line BL1. Subsequently, as in the case of the other embodiments, the plate line PL1 is driven and the sense amplifier SA executes amplification, then the memory shifts to the standby state.

[7-3] Effects

In the random access memory according to the seventh embodiment of the present invention, the connection node of the two blocks B is connected to the bit line BL via one block selection transistor TS as in the case of the sixth embodiment. This serves to produce the same effects as in the sixth embodiment.

Further, according to the seventh embodiment, in the block B, the switch transistor TC and the memory cell MC are connected together in series as in the case of the first embodiment. This reduces the parasitic capacitance of the plate line PL and thus the power consumption of the ferromagnetic random access memory.

(8) Eighth Embodiment

FIG. 35 is a diagram schematically showing a ferromagnetic random access memory according to an eighth embodiment of the present invention. As shown in FIG. 35, the block selection transistors TS3 and TS4 are connected to the bit line BL1 compared to the configuration of the seventh embodiment. The remaining part of the configuration is the same as in the seventh embodiment. Operations are also similar to those in the seventh embodiment.

In the random access memory according to the eighth embodiment of the present invention, the connection node of the two blocks B is connected to the bit line BL via one block selection transistor TS as in the case of the seventh embodiment. Further, in the block B, the switch transistor TC and the memory cell MC are connected together in series. This reduces the parasitic capacitance of the bit line BL and plate line P.

Furthermore, according to the eighth embodiment, two columns of blocks B arranged in the direction in which the word line WL extends is connected to one bit line BL. This reduces the number of bit lines BL to half compared to the case in which the bit line BL is provided for every column. Therefore, the bit lines BL can be easily laid out.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferromagnetic random access memory comprising:
   a first block including a first switch transistor and a plurality of first memory cells connected in series between a first end and a second end, the first memory cell including a ferromagnetic capacitor and a cell transistor connected in parallel, at least one of the plurality of first memory cells being connected between the first end of the first block and the first switch transistor;
   a second block including a second switch transistor and a plurality of second memory cells connected in series between a first end and a second end, the second memory cell including a ferromagnetic capacitor and a cell transistor connected in parallel;
   a first plate line connected to the first end of the first block and the first end of the second block;
   a first block selection transistor including a current path, one end of the current path being connected to the second end of the first block;
   a second block selection transistor including a current path, one end of the current path being connected to the second end of the second block; and
   a first bit line connected to another end of the current path in the first block selection transistor and to another end of the current path in the second block selection transistor.

2. The memory according to claim 1, wherein at least one of the plurality of first memory cells is connected between the second end of the first block and the first switch transistor.

3. The memory according to claim 1, wherein at least two of the plurality of first memory cells are connected in series via the first switch transistor.

4. The memory according to claim 1, wherein the first block includes $2^n$ (n being a natural number) of the first memory cells and $2^n$ first switch transistors connected in series with the first memory cells, and the first memory cells and the first switch transistors are alternately connected in series.

5. The memory according to claim 1, wherein at most two of the first memory cells are connected between the first end of the first block and the first switch transistor.

6. The memory according to claim 1, wherein at most two of the first memory cells are connected between the second end of the first block and the first switch transistor.

7. The memory according to claim 1, wherein the second switch transistor is turned off when the first memory cell is accessed.

8. The memory according to claim 7, wherein the first block selection transistor is turned on and the second block selection transistor is turned off when the first memory cell is accessed.

9. The memory according to claim 1, wherein the first block includes as many first switch transistors as the first memory cells, the second block includes as many second memory cells as the first memory cells and as many second switch transistors as the first memory cells, the first memory cells and the first switch transistors are alternately connected in series, the second memory cells and the second switch transistors are alternately connected in series, and when the x-th (x is a natural number equal to or smaller than the number of the first memory cells) of the first memory cells from the second end of the first block is accessed, the cell transistor of the x-th of the first memory cells from the second end of the first block and the x-th of the second switch transistors from the first end of the second block are turned off.

10. The memory according to claim 9, wherein when the first memory cell is accessed, the first block selection transistor is turned on and the second block selection transistor is turned off.

11. The memory according to claim 9, wherein when the first memory cell is accessed, the first block selection transistor and the second block selection transistor are turned on.

12. A ferromagnetic random access memory comprising:
a first block including a switch transistor and a plurality of memory cells connected in series between a first end and a second end, the memory cell including a ferromagnetic capacitor and a cell transistor connected in parallel;
a second block including a switch transistor and a plurality of memory cells connected in series between a first end and a second end, the memory cell including a ferromagnetic capacitor and a cell transistor connected in parallel;
a first plate line connected to the first end of the first block;
a second plate line connected to the first end of the second block;
a first block selection transistor including a current path, one end of the current path being connected to the second end of the first block and to the second end of the second block;
a first bit line connected to another end of the current path in the first block selection transistor;
a third block including a switch transistor and a plurality of memory cells connected in series between a first end and a second end, the memory cell including a ferromagnetic capacitor and a cell transistor connected in parallel;
a fourth block including a switch transistor and a plurality of memory cells connected in series between a first end and a second end, the memory cell including a ferromagnetic capacitor and a cell transistor connected in parallel;
a third plate line connected to the first end of the third block;
a fourth plate line connected to the first end of the fourth block; and
a second block selection transistor including a current path, one end of the current path is connected to the second end of the third block and to the second end of the fourth block and, another end of the current path is connected to another end of the current path in the first block selection transistor.

13. The memory according to claim 12, further comprising:
a fifth block including a switch transistor and a plurality of memory cells connected in series between a first end and a second end, the memory cell including a ferromagnetic capacitor and a cell transistor connected in parallel, the first end being connected to the second plate line;
a sixth block including a switch transistor and a plurality of memory cells connected in series between a first end and a second end, the memory cell including a ferromagnetic capacitor and a cell transistor connected in parallel;
a fifth plate line connected to the first end of the sixth block; and
a third block selection transistor including a current path, one end of the current path being connected to the second end of the fifth block and to the second end of the sixth block and, another end of the current path being connected to the first bit line.

14. The memory according to claim 13, further comprising:
a seventh block including a switch transistor and a plurality of memory cells connected in series between a first end and a second end, the memory cell including a ferromagnetic capacitor and a cell transistor connected in parallel, the first end being connected to the fourth plate line;
an eighth block including a switch transistor and a plurality of memory cells connected in series between a first end and a second end, the memory cell including a ferromagnetic capacitor and a cell transistor connected in parallel;
a sixth plate line connected to the first end of the eighth block; and
a fourth block selection transistor including a current path, one end of the current path is connected to the second end of the seventh block and to the second end of the eighth block and, another end of the current path is connected to another end of the current path in the second block selection transistor.

15. The memory according to claim 12, further comprising:
a fifth block including a switch transistor and a plurality of memory cells connected in series between a first end and a second end, the memory cell including a ferromagnetic capacitor and a cell transistor connected in parallel, the first end being connected to the second plate line;

a sixth block including a switch transistor and a plurality of memory cells connected in series between a first end and a second end, the memory cell including a ferromagnetic capacitor and a cell transistor connected in parallel;

a fifth plate line connected to the first end of the sixth block; and a third block selection transistor including a current path, one end of the current path being connected to the second end of the fifth block and to the second end of the sixth block and, another end of the current path being connected to a second bit line.

* * * * *